United States Patent
Jang et al.

(10) Patent No.: US 12,272,709 B2
(45) Date of Patent: Apr. 8, 2025

(54) IMAGE SENSOR WHEREIN THE TRANSFER GATE CONTACTS A FIRST REFRACTIVE LAYER THAT IS COPLANAR WITH A SECOND REFRACTIVE LAYER

(71) Applicant: SAMSUNG ELECTRONICS CO., LTD., Suwon-si (KR)

(72) Inventors: Minho Jang, Suwon-si (KR); Jeongsoon Kang, Gum-si (KR); Donghyun Kim, Hwaseong-si (KR); Seungkuk Kang, Seoul (KR); Insung Joe, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 477 days.

(21) Appl. No.: 17/655,576

(22) Filed: Mar. 21, 2022

(65) Prior Publication Data
US 2023/0030489 A1     Feb. 2, 2023

(30) Foreign Application Priority Data
Jul. 30, 2021 (KR) .................. 10-2021-0100683

(51) Int. Cl.
*H01L 27/146*     (2006.01)

(52) U.S. Cl.
CPC .... *H01L 27/1463* (2013.01); *H01L 27/14603* (2013.01); *H01L 27/14629* (2013.01); *H01L 27/14636* (2013.01); *H01L 27/1464* (2013.01); *H01L 27/14643* (2013.01)

(58) Field of Classification Search
CPC .......... H01L 27/1463; H01L 27/14603; H01L 27/14629; H01L 27/14636; H01L 27/14643; H01L 27/1464
See application file for complete search history.

(56) References Cited

U.S. PATENT DOCUMENTS

| 8,957,358 | B2 | 2/2015 | Wan et al. | |
| 9,942,461 | B2 * | 4/2018 | Kim | H01L 27/14612 |
| 9,947,714 | B2 * | 4/2018 | Lee | H01L 27/14636 |
| 9,978,787 | B1 * | 5/2018 | Park | H01L 27/14616 |
| 10,090,349 | B2 * | 10/2018 | Wan | H01L 27/1469 |

(Continued)

FOREIGN PATENT DOCUMENTS

| KR | 10-2020-0097716 | 8/2020 |
| WO | WO 2020/129712 | 6/2020 |

*Primary Examiner* — Davienne N Monbleau
*Assistant Examiner* — Dmitri Mihaliov
(74) *Attorney, Agent, or Firm* — F. CHAU & ASSOCIATES, LLC

(57) ABSTRACT

An image sensor includes a first structure, a second structure, and a third structure that are sequentially stacked in a vertical direction. The first structure includes a first substrate and at least one first transistor disposed on the first substrate. The second structure includes a second substrate and at least one second transistor disposed on the second substrate. The third structure includes a third substrate that includes an upper surface on which light is incident and a lower surface that is opposite to the upper surface, a photoelectric conversion region disposed in the third substrate, a transfer gate disposed on the lower surface of the third substrate, and a reflective structure disposed on the lower surface of the third substrate and on a lower surface and side surface of the transfer gate.

20 Claims, 19 Drawing Sheets

(56) References Cited

U.S. PATENT DOCUMENTS

| | | |
|---|---|---|
| 10,163,946 B2 | 12/2018 | Kwon |
| 10,373,999 B2 * | 8/2019 | Yamashita ........ H01L 27/14629 |
| 10,573,679 B2 | 2/2020 | Kwon |
| 10,651,225 B2 | 5/2020 | Huang et al. |
| 10,834,347 B2 | 11/2020 | Jung et al. |
| 12,094,979 B2 * | 9/2024 | Yamazaki ......... H01L 21/76831 |
| 2019/0196108 A1 * | 6/2019 | Cai ...................... G02B 6/0008 |
| 2021/0084249 A1 | 3/2021 | Nakazawa et al. |
| 2021/0375866 A1 | 12/2021 | Baba |
| 2022/0109014 A1 * | 4/2022 | Song ................. H01L 27/14636 |

* cited by examiner

IMAGE SENSOR WHEREIN THE TRANSFER GATE CONTACTS A FIRST REFRACTIVE LAYER THAT IS COPLANAR WITH A SECOND REFRACTIVE LAYER

CROSS-REFERENCE TO RELATED APPLICATION

This application claims priority under 35 U.S.C. § 119 from Korean Patent Application No. 10-2021-0100683, filed on Jul. 30, 2021 in the Korean Intellectual Property Office, the contents of which are herein incorporated by reference in their entirety.

TECHNICAL FIELD

Embodiments of the inventive concept are directed to an image sensor, in particular, to a CMOS image sensor.

DISCUSSION OF THE RELATED ART

An image sensor is a device that converts an optical image into an electrical signal and is used in cameras of portable electronic devices such as smart phones or tablets. To reduce the size of a portable electronic device and improve the performance of a camera, the area of each pixel of the image sensor is reduced. However, decreasing the pixel area may cause a decrease in the sensitivity of the image sensor.

SUMMARY

According to an embodiment of the inventive concept, there is provided an image sensor that includes a first structure, a second structure, and a third structure that are sequentially stacked in a vertical direction. The first structure includes a first substrate and at least one first transistor disposed on the first substrate. The second structure includes a second substrate and at least one second transistor disposed on the second substrate. The third structure includes a third substrate that includes an upper surface on which light is incident and a lower surface that is opposite to the upper surface, a photoelectric conversion region disposed in the third substrate, a transfer gate disposed on the lower surface of the third substrate, and a reflective structure disposed on the lower surface of the third substrate and on a lower surface and side surface of the transfer gate. The reflective structure includes a first refractive index layer disposed on the lower surface of the third substrate and on the lower surface and the side surface of the transfer gate, and a second refractive index layer disposed on a lower surface of a portion of the first refractive index layer on the lower surface of the third substrate. The lower surface of the portion of the first refractive index layer on the lower surface of the transfer gate is coplanar with a lower surface of the second refractive index layer.

According to another embodiment of the inventive concept, there is provided an image sensor that includes a first structure, a second structure, and a third structure that are sequentially stacked in a vertical direction. The first structure includes a first substrate and at least one first transistor disposed on the first substrate. The second structure includes a second substrate and at least one second transistor disposed on the second substrate. The third structure includes a third substrate that includes an upper surface on which light is incident and a lower surface that is opposite to the upper surface, a photoelectric conversion region disposed in the third substrate, a transfer gate disposed on the lower surface of the third substrate, and a reflective structure disposed on the lower surface of the third substrate and on a lower surface and side surface of the transfer gate. The reflective structure includes a first refractive index layer disposed on the lower surface of the third substrate and on the lower surface and the side surface of the transfer gate, and a second refractive index layer disposed on the first refractive index layer. A lower surface of a portion of the second refractive index layer on a portion of the first refractive index layer on the lower surface of the transfer gate is coplanar with a lower surface of a portion of the second refractive index layer on a portion of the first refractive index layer on the lower surface of the third substrate.

According to another embodiment of the inventive concept, there is provided an image sensor that includes a first structure and a second structure that are sequentially stacked in a vertical direction. The first structure includes a first substrate, and a reset transistor and a source follower transistor disposed on the first substrate. The second structure includes a second substrate that includes an upper surface on which light is incident and a lower surface that is opposite to the upper surface, a plurality of photoelectric conversion regions disposed in the second substrate, a plurality of transfer gates disposed on the lower surface of the second substrate and that are respectively connected to the plurality of photoelectric conversion regions, a plurality of floating diffusion regions disposed on the lower surface of the second substrate and that are respectively connected to the plurality of transfer gates, and a reflective structure disposed on the lower surface of the second substrate and on a lower surface and a side surface of the transfer gate. The plurality of floating diffusion regions are commonly connected to the reset transistor and the source follower transistor, respectively. The reflective structure includes a first refractive index layer disposed on the lower surface of the second substrate and on the lower surface and the side surface of the transfer gate, and a second refractive index layer disposed on a lower surface of a portion of the first refractive index layer on the lower surface of the second substrate. The lower surface of the portion of the first refractive index layer on the lower surface of the transfer gate is coplanar with the lower surface of the second refractive index layer.

DETAILED DESCRIPTION

Figure 1:
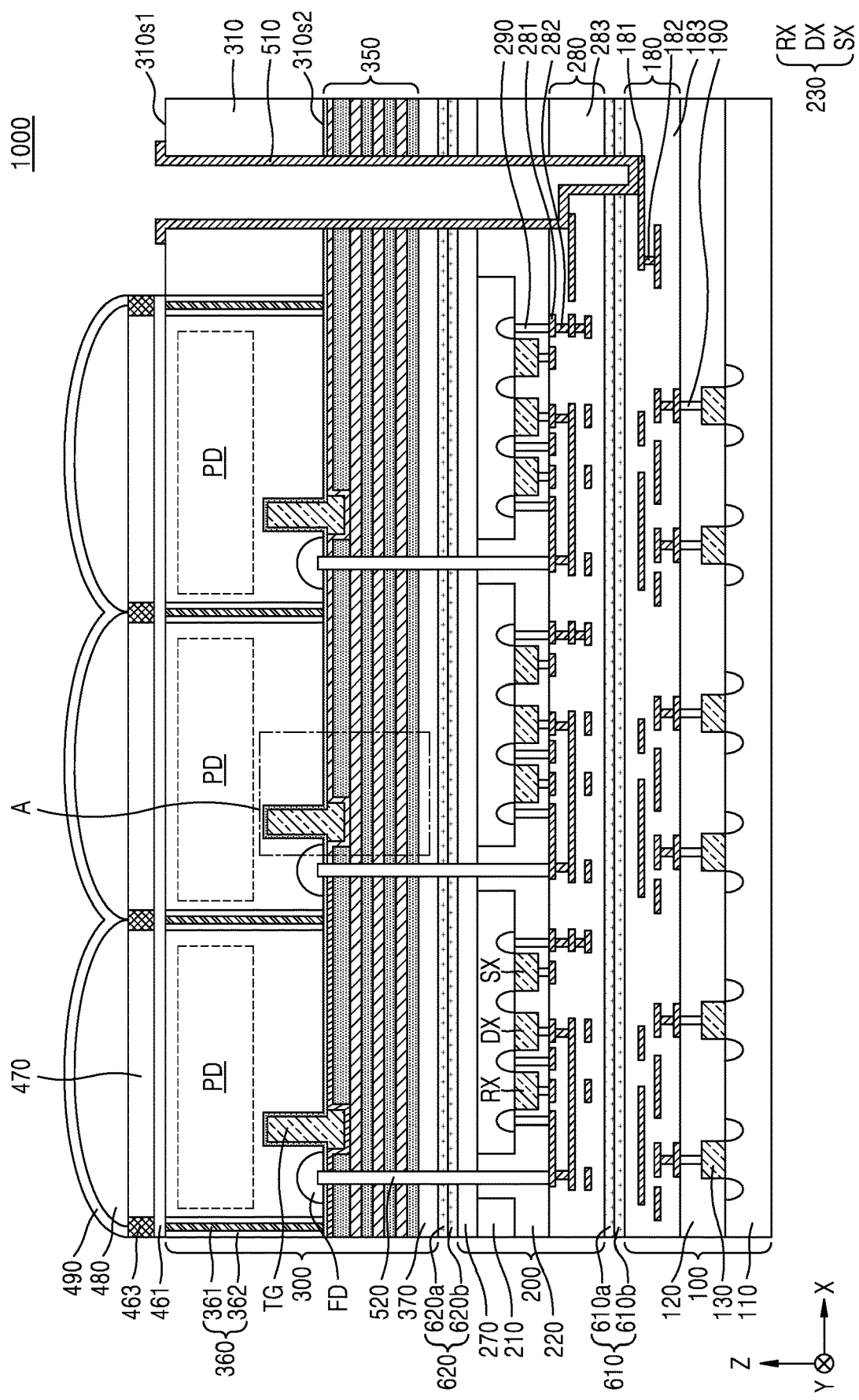
FIG. 1 is a cross-sectional view of an image sensor according to an embodiment of the inventive concept.
Figure 2:
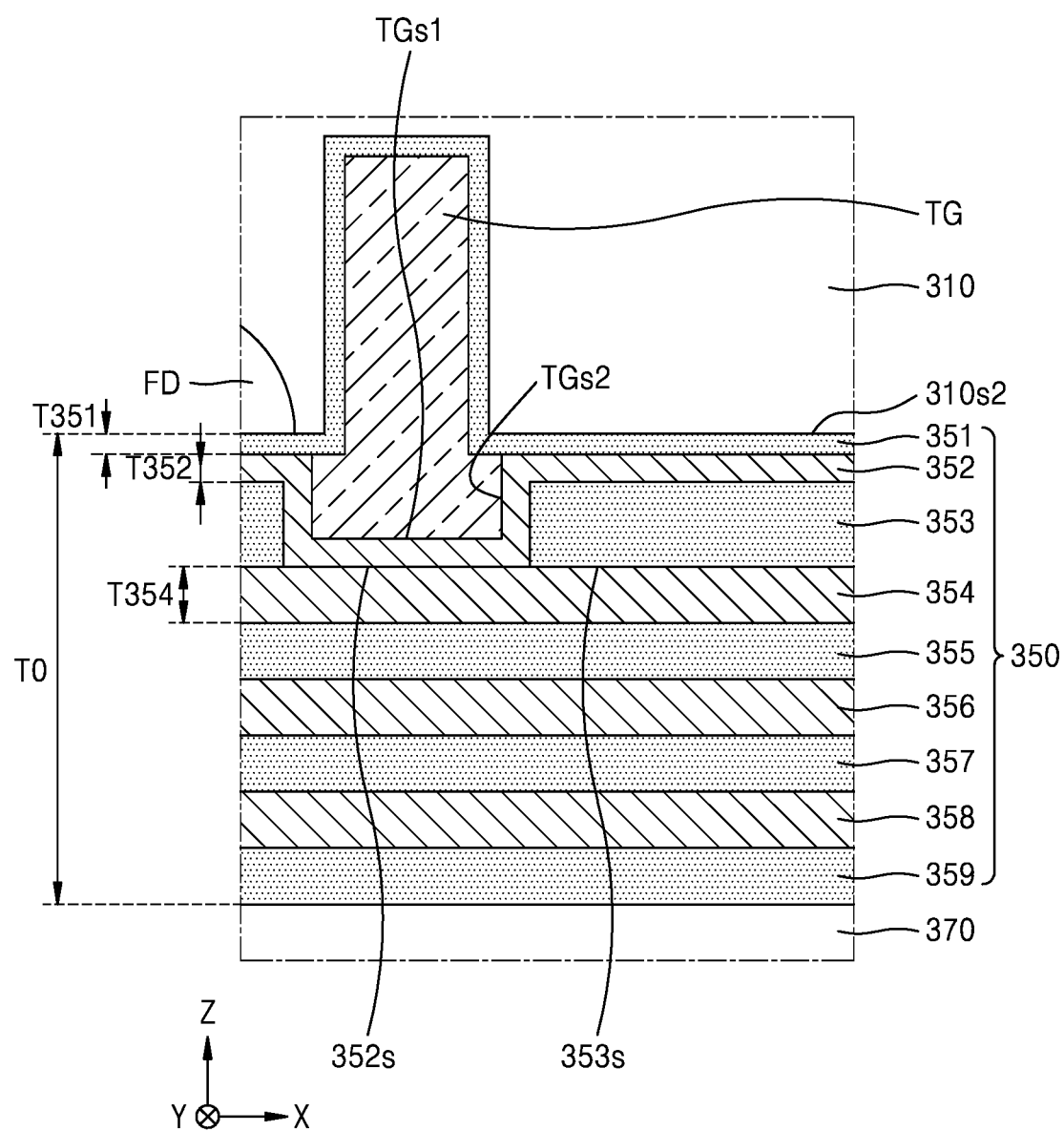
FIG. 2 is an enlarged view of area A of FIG. 1.
Figure 3:
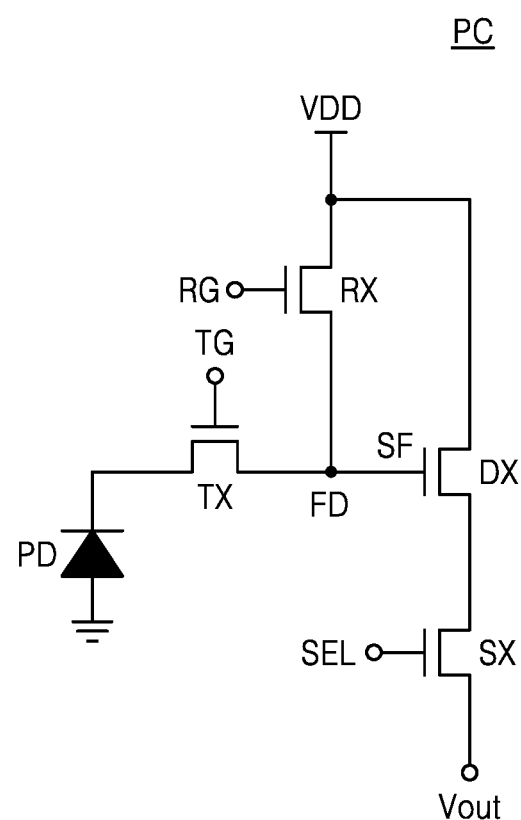
FIG. 3 is a circuit diagram of a pixel circuit in an image sensor according to an embodiment of the inventive concept.

FIG. 1 is a cross-sectional view of an image sensor 1000 according to an embodiment of the inventive concept. FIG. 2 is an enlarged view of area A of FIG. 1. FIG. 3 is a circuit diagram of a pixel circuit PC in the image sensor 1000 according to an embodiment of the inventive concept.

Referring to FIGS. 1 to 3, in an embodiment, the image sensor 1000 includes first to third structures 100 to 300 stacked in a vertical direction (Z direction). That is, the second structure 200 is disposed on the first structure 100, and the third structure 300 is disposed on the second structure 200. In some embodiments, the image sensor 1000 further includes a first bonding layer 610 between the first structure 100 and the second structure 200 and a second bonding layer 620 between the second structure 200 and the third structure 300. The image sensor 1000 further includes a first through via 510 that connects the first structure 100 and the second structure 200 to each other, and a second through via 520 that connects the second structure 200 and the third structure 300 to each other. In some embodiments, the image sensor 1000 further includes an anti-reflective layer 461 disposed on the third structure 300, a fence 463 disposed on the anti-reflective layer 461, a color filter 470 disposed on the anti-reflective layer 461, a microlens 480 disposed on the color filter 470, and a capping layer 490 disposed on the microlens 380.

The first structure 100 includes a first substrate 110 and at least one first transistor 130 disposed on the first substrate 110. The first structure 100 further includes a first interlayer insulating layer 120 disposed on the first substrate 110 and on the first transistor 130. The first structure 100 further includes a first connection structure 180 disposed on the first interlayer insulating layer 120. The first structure 100 further include a first contact 190 disposed in the interlayer insulating layer 120 that electrically connects the first connection structure 180 and the first transistor 130 to each other.

The first substrate 110 includes a semiconductor material such as a group IV semiconductor material, a group III-V semiconductor material, or a group II-VI semiconductor material. The group IV semiconductor material includes, for example, silicon (Si), germanium (Ge), or silicon (Si)-germanium (Ge). The III-V group semiconductor material includes, for example, gallium arsenide (GaAs), indium phosphorus (InP), gallium phosphorus (GaP), indium arsenic (InAs), indium antimony (InSb), or indium gallium arsenide (InGaAs). The II-VI semiconductor material includes, for example, zinc telluride (ZnTe) or cadmium sulfide (CdS).

The first transistor 130 is disposed on the first substrate 110. The first transistor 130 may be referred to as a logic transistor. A plurality of first transistors 130 are disposed on the first substrate 110, and the plurality of first transistors 130 form a logic circuit. The logic circuit includes at least one of a row decoder, a row driver, a column decoder, a timing generator, a correlated double sampler (CDS), an analog to digital converter, and an I/O buffer.

The first interlayer insulating layer 120 covers the first substrate 110 and the first transistor 130. The first interlayer insulating layer 120 includes, for example, at least one of silicon oxide, silicon nitride, silicon oxynitride, a low-k material, or a combination thereof. The low-k material includes, for example, at least one of Flowable Oxide (FOX), Torene SilaZene (TOSZ), Undoped Silica Glass (USG), Borosilica Glass (BSG), PhosphoSilica Glass (PSG), BoroPhosphoSilica Glass (BPSG), Plasma Enhanced Tetra Ethyl Ortho Silicate (PETEOS), Fluoride Silicate Glass (FSG), Carbon Doped silicon Oxide (CDO), Xerogel, Aerogel, Amorphous Fluorinated Carbon, Organo Silicate Glass (OSG), Parylene, bis-benzocyclobutenes (BCB), SILK, polyimide, a porous polymeric material, or a combination thereof.

The first connection structure 180 is disposed on the first interlayer insulating layer 120. The first connection structure 180 includes a first insulating layer 183, and a plurality of first conductive lines 181 and a plurality of first conductive vias 182 disposed in the first insulating layer 183. The first insulating layer 183 includes at least one of silicon oxide, silicon nitride, silicon oxynitride, a low-k material, or a combination thereof. The first conductive line 181 and the first conductive via 182 include at least one of copper (Cu), aluminum (Al), silver (Ag), gold (Au), titanium (Ti), tungsten (W), or a combination thereof.

The first contact 190 penetrates the first interlayer insulating layer 120 and electrically connects the first connection structure 180 and the first transistor 130 to each other. The first contact 190 includes at least one of tungsten (W), copper (Cu), aluminum (Al), silver (Ag), gold (Au), titanium (Ti), polysilicon, or a combination thereof.

The second structure 200 includes a second substrate 210 and at least one second transistor 230 disposed on the second substrate 210, such as a reset transistor RX, a source follower transistor DX, and a select transistor SX. The second structure 200 further includes a second interlayer insulating layer 220 disposed on the second substrate 210 and the second transistors such as the reset transistor RX, the source follower transistor DX, and the select transistor DX. The second structure 200 further includes a second connection structure 280 disposed on the second interlayer insulating layer 220. The second structure 200 further includes a second contact 290 disposed in the second interlayer insulating layer 220 and that electrically connects the second connection structure 280 and the second transistor 230 to each other. In some embodiments, the second structure 200 further includes a first bonding insulating layer 270 disposed on an upper surface of the second substrate 210.

The second substrate 210 includes a semiconductor material. A plurality of second transistors 230, such as the reset transistor RX, the source follower transistor DX, and the select transistor SX, are disposed on the second substrate 210.

The second interlayer insulating layer 220 covers the second substrate 210, the reset transistor RX, the source follower transistor DX, and the select transistor SX. The second insulating layer 220 includes at least one of silicon oxide, silicon nitride, silicon oxynitride, a low-k material, or a combination thereof.

The second connection structure 280 is disposed on the second interlayer insulating layer 220. The second connection structure 280 includes a second insulating layer 283 and a plurality of second conductive lines 281 and a plurality of second conductive vias 282 disposed in the second insulating layer 283. The second insulating layer 283 includes at least one of silicon oxide, silicon nitride, silicon oxynitride, a low-k material, or a combination thereof. The second conductive line 281 and the second conductive via 282 each include at least one of copper (Cu), aluminum (Al), silver (Ag), gold (Au), titanium (Ti), tungsten (W), or a combination thereof.

The second contact 290 electrically connects the second connection structure 280 and the plurality of second transistors 230, such as the reset transistor RX, the select transistor SX, and the source follower transistor DX, to each other. The second contact 290 includes at least one of tungsten (W), copper (Cu), aluminum (Al), silver (Ag), gold (Au), titanium (Ti), polysilicon, or a combination thereof.

The first bonding insulating layer 270 is disposed on an upper surface of the second substrate 210. The first bonding insulating layer 270 includes at least one of silicon oxide, silicon nitride, silicon oxynitride, a low-k material, or a combination thereof.

The third structure 300 includes a third substrate 310, a photoelectric conversion region PD disposed in the third substrate 310, a transfer gate TG disposed on a lower surface 310s2 of the third substrate 310, and a reflective structure 350 disposed on the lower surface 310s2 of the third substrate 310 and the transfer gate TG. The third structure 300 further includes a floating diffusion region FD disposed in the third substrate 310 and covered by the third substrate 310. The third structure 300 further includes a pixel isolation structure 360 that surrounds each photoelectric conversion region PD. The third structure 300 further includes a second bonding insulating layer 370 disposed on a lower surface of the reflective structure 350.

The third substrate 310 includes a semiconductor material. The third substrate 310 includes an upper surface 310s1 and a lower surface 310s2 that face each other. The upper surface 310s1 of the third substrate 310 is a surface on which light is incident.

The photoelectric conversion region PD is disposed in the third substrate 310. The photoelectric conversion region PD includes a photodiode. In this case, the photoelectric conversion region PD includes an impurity region that has a conductivity type opposite to that of the third substrate 310. In other embodiments, the photoelectric conversion region PD includes at least one of a photo transistor, a photo gate, or a pinned photo diode.

The pixel isolation structure 360 completely penetrates the third substrate 310 in the vertical direction (Z direction) from the lower surface 310s2 to the upper surface 310s1 of the third substrate 310. In another embodiment, unlike that shown in FIG. 1, the pixel isolation structure 360 does not completely penetrate the third substrate 310. The pixel isolation structure 360 separates the third substrate 310 into a plurality of pixel regions. The pixel isolation structure 360 electrically isolates the plurality of photoelectric conversion regions PD from each other.

The pixel isolation structure 360 may include a pixel isolation conductive layer 361 and a pixel isolation insulating layer 362. In some embodiments, each of the pixel isolation conductive layer 361 and the pixel isolation insulating layer 362 completely penetrate the third substrate 310 from the bottom surface 310s2 to the upper surface 310s1 of the third substrate 310. In another embodiment, neither of the pixel isolation conductive layer 361 and the pixel isolation insulating layer 362 completely penetrate the third substrate 310. The pixel isolation insulating layer 362 is formed between the pixel isolation conductive layer 361 and the third substrate 310 and electrically isolates the pixel isolation conductive layer 361 from the third substrate 310.

In some embodiments, the pixel isolation conductive layer 361 includes a conductive material such as polysilicon or metal. In some embodiments, the pixel isolation insulating layer 362 includes a metal oxide such as hafnium oxide, aluminum oxide, or tantalum oxide. In this case, the pixel isolation insulating layer 362 acts as a negative fixed charge layer. In other embodiments, the pixel isolation insulating layer 362 includes another insulating material such as silicon oxide, silicon nitride, silicon oxynitride, or a combination thereof.

The floating diffusion region FD is disposed in the third substrate 310 adjacent to the lower surface 310s2 of the third substrate 310. The floating diffusion region FD is an impurity region in the third substrate 310.

The transfer gate TG is positioned on the lower surface 310s2 of the third substrate 310 adjacent to the floating diffusion region FD. In some embodiments, the transfer gate TG is recessed into the third substrate 310 from the lower surface 310s2 of the third substrate 310. In another embodiment, unlike that shown in FIGS. 1 and 2, the transfer gate TG is not recessed into the third substrate 310.

The photoelectric conversion region PD, the transfer gate TG, and the floating diffusion region PD of the first structure 100, and the reset transistor RX, the source follower transistor DX, and the select transistor SX of the second structure 200 form a pixel circuit PC as shown in FIG. 3.

The photodiode PD generates charges, such as electrons and holes, according to the amount of incident light. The transfer gate TG transmits the charges received from the photodiode PD to the floating diffusion region FD. The transfer gate TG is a gate of a transmit transistor TX. The floating diffusion region FD accumulates charges.

The source follower transistor DX generates a source-drain current according to the amount of photocharges accumulated in the floating diffusion region FD. The source follower transistor DX acts as a buffer amplifier that amplifies a potential change in the floating diffusion region FD and outputs the amplified signal to an output line Vout through the select transistor SX. The source follower transistor DX includes a source follower gate SF. The source follower gate SF is connected to the floating diffusion region FD, the drain of the source follower transistor DX is connected to the power supply voltage VDD, and the source of the source follower transistor DX is connected to a drain of the select transistor SX.

The reset transistor RX periodically resets charges accumulated in the floating diffusion region FD. The reset transistor RX includes a reset gate RG. The drain electrode of the reset transistor RX is connected to the floating diffusion region FD, and the source electrode of the reset transistor RX is connected to the power voltage VDD. When the reset transistor RX is turned on, the power voltage VDD connected to the source electrode of the reset transistor RX is transmitted to the floating diffusion region FD. When the reset transistor RX is turned on, charges accumulated in the floating diffusion region FD are discharged to reset the floating diffusion region FD.

The select transistor SX serves as a switch and is used to select a plurality of pixel circuits PC in a row unit. The select transistor SX includes a select gate SEL. When the select transistor SX is turned on, the power supply voltage VDD connected to the drain electrode of the source follower transistor DX is transmitted to the drain electrode of the select transistor SX.

The reflective structure 350 includes a plurality of refractive index layers stacked on the lower surface 310s2 of the third substrate 310, such as first to ninth refractive index layers 351 to 359. In FIGS. 1 and 2, the reflective structure 350 is shown as including nine refractive index layers, such as the first to ninth refractive index layers 351 to 359, but the number of refractive index layers in the reflective structure 350 is not limited thereto, and can be modified in other embodiments. The reflective structure 350 increases the sensitivity of the image sensor 1000 by reflecting light exiting the lower surface 310s2 of the third substrate 310 toward the third substrate 310. The thickness T0 in the vertical direction (Z direction) of the reflective structure 350 is from about 500 nm to about 1000 nm.

The second refractive index layer 352 is disposed on the lower surface 310s2 of the third substrate 310 and a lower surface TGs1 and a side surface TGs2 of the transfer gate TG. The second refractive index layer 352 serves as a passivation layer for the transfer gate TG. Since the transfer gate TG extends into the reflective structure 350, the second refractive index layer 352 has a stepped portion that conformally surrounds the transfer gate TG. The third refractive index layer 353 is disposed on a portion of the second refractive index layer 352 on the lower surface 310s2 of the third substrate 310. The transfer gate and the second refractive index layer 352 extend through the third refractive index layer 353. The lower surface 352s of the portion of the second refractive index layer 352 on the lower surface TGs1 of the transfer gate TG is coplanar with the lower surface 353s of the third refractive index layer 353.

A fourth refractive index layer 354 is disposed on the lower surface 353s of the third refractive index layer 353. In some embodiments, the fourth refractive index layer 354 is in direct contact with the second refractive index layer 352 where the lower surface 352s of the portion of the second refractive index layer 352 is coplanar with the lower surface 353s of the third refractive index layer 353. In some embodiments, the thickness T354 in the vertical direction (Z direction) of the fourth refractive index layer 354 is greater than the thickness T352 in the vertical direction (Z direction) of the second refractive index layer 352. For example, the thickness T352 in the vertical direction (Z direction) of the second refractive index layer 352 is from about 30 nm to about 50 nm, and the thickness T354 in the vertical direction (Z direction) of the fourth refractive index layer 354 is from about 50 nm to about 100 nm.

The first refractive index layer 351 extends between the second refractive index layer 352 and the third substrate 310 and between the transfer gate TG and the third substrate 310. The first refractive index layer 351 serve as a gate insulating layer for the transfer gate TG. The thickness T351 in the vertical direction (Z direction) of the first refractive index layer 351 is less than the thickness T352 in the vertical direction (Z direction) of the second refractive index layer 352. For example, the thickness T351 in the vertical direction (Z direction) of the first refractive index layer 351 is from about 5 nm to about 30 nm.

The first refractive index layer 351 and the second refractive index layer 352 are not flat due to the transfer gate TG. However, the third to ninth refractive index layers 353 to 359 are flat. The flat third to ninth refractive index layers 353 to 359 increase the reflectance of the reflective structure 350. By forming the reset transistor RX, the source follower transistor DX, and the select transistor SX on the second substrate 210 instead of the third substrate 310, the reset transistor RX, the source follower transistor DX, and the select transistor SX can be prevented from interfering with the reflection of the reflective structure 350. Accordingly, the reflection of the reflective structure 350 is increased and the sensitivity of the image sensor 1000 is increased.

A pair of adjacent refractive index layers, such as the first refractive index layer 351 and the second refractive index layer 352, the second refractive index layer 352 and a third refractive index layer 353; the third refractive index layer 353 and the fourth refractive index layer 354, the fourth refractive index layer 354 and the fifth refractive index layer 355, the fifth refractive index layer 355 and the sixth refractive index layer 356, the sixth refractive index layer 356 and the seventh refractive index layer 357, the seventh refractive index layer 357 and the eighth refractive index layer 358, or the eighth refractive index layer 358 and the ninth refractive index layer 359, include different materials. In some embodiments, the first refractive index layer 351, the third refractive index layer 353, the fifth refractive index layer 355, the seventh refractive index layer 357, and the ninth refractive index layer 359 are made of the same material, such as silicon oxide, and the fourth refractive index layer 354, the sixth refractive index layer 356, and the eighth refractive index layer 358 include the same material, such as silicon nitride or titanium oxide. The second refractive index layer 352 may include the same or a different material as the fourth refractive index layer 359. The second refractive index layer 352 includes, for example, silicon nitride.

The second bonding insulating layer 370 is disposed on the lower surface of the reflective structure 350. The second bonding insulating layer 370 includes at least one of silicon oxide, silicon nitride, silicon oxynitride, a low-k material, or a combination thereof.

The first bonding layer 610 bonds the first structure 100 and the second structure 200 to each other. The first bonding layer 610 includes a pair of first sub-bonding layers 610a and 610b in direct contact with each other. When the pair of first sub-bonding layers 610a and 610b include the same material, a boundary between the pair of first sub-bonding layers 610a and 610b may be unclear. The pair of first sub-bonding layers 610a and 610b include, for example, at least one of silicon oxide ($SiO_2$), silicon nitride (SiN), silicon oxynitride (SiON), silicon carbonitride (SiCN), silicon oxycarbide (SiOC), or a combination thereof.

The second bonding layer 620 bonds the second structure 200 and the third structure 300 to each other. The second bonding layer 620 includes a pair of second sub-bonding layers 620a and 620b in direct contact with each other. When the pair of second sub-bonding layers 620a and 620b include the same material, a boundary between the pair of second sub-bonding layers 620a and 620b may be unclear. The pair of second sub-bonding layers 620a and 620b include, for example, at least one of silicon oxide ($SiO_2$), silicon nitride (SiN), silicon oxynitride (SiON), silicon carbonitride (SiCN), silicon oxycarbide (SiOC), or a combination thereof.

The first through via 510 penetrates the third structure 300 and the second structure 200. The first through via 510 electrically connects the second connection structure 280 of the second structure 200 and the first connection structure 180 of the first structure 100 to each other. The first through via 510 includes at least one of copper (Cu), silver (Ag), gold (Au), aluminum (Al), tungsten (W), titanium (Ti), or a combination thereof. The first through via 510 is formed at an outer portion of the image sensor 10000.

The second through via 520 penetrates the reflective structure 350, the second bonding insulating layer 370, the second bonding layer 620, the first bonding insulating layer 270, and the second interlayer insulating layer 220. The second through via 520 electrically connects the floating diffusion region FD of the third structure 300 to the reset transistor RX and the source-follower transistor DX of the second structure 200. The second through via 520 includes at least one of copper (Cu), silver (Ag), gold (Au), aluminum (Al), tungsten (W), titanium (Ti), or a combination thereof. The second through via 520 directly contacts the reflective structure 350.

The anti-reflective layer 461 is disposed on the upper surface 310s1 of the third substrate 310. The anti-reflective layer 461 includes at least one of hafnium oxide ($HfO_2$), silicon nitride (SiN), aluminum oxide ($Al_2O_3$), zirconium oxide ($ZrO_2$), tantalum oxide ($Ta_2O_5$), titanium oxide ($TiO_2$), lanthanum oxide ($La_2O_3$), praseodymium oxide ($Pr_2O_3$), cerium oxide ($CeO_2$), neodymium Oxide ($Nd_2O_3$), promethium Oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), thulium oxide ($Tm_2O_3$), ytterbium oxide ($Yb_2O_3$), ruthenium oxide ($Lu_2O_3$), or yttrium oxide ($Y_2O_3$).

The fence 463 is disposed on the anti-reflective layer 461. The fence 463 is aligned in the vertical direction (Z direction) with the pixel isolation structure 360. The fence 463 includes a metal or a low refractive index material. For example, the low refractive index material includes at least one of polymethylmetacrylate (PMMA), silicon acrylate, cellulose acetate butyrate (CAB), silica, or fluoro-silicon acrylate (FSA). For example, the low refractive index material includes a polymer material in which silica (SiOx) particles are dispersed.

The color filter 470 is disposed on the anti-reflective layer 461 and is surrounded by the fence 463. The plurality of color filters 470 include, for example, a green filter, a blue filter, and a red filter. In another embodiment, the plurality of color filters 470 include, for example, a cyan filter, a magenta filter, and a yellow filter.

The microlens 480 is disposed on the color filter 470. The microlens 480 collects incident light, and the collected light is incident onto the photoelectric conversion region PD through the color filter 470. One microlens 480 is arranged to correspond to one photoelectric conversion region PD. The microlens 480 includes, for example, at least one of a styrene-based resin, an acrylic resin, a styrene-acrylic copolymer-based resin, or a siloxane-based resin. A capping layer 490 is disposed on the microlens 480.

Figure 4:
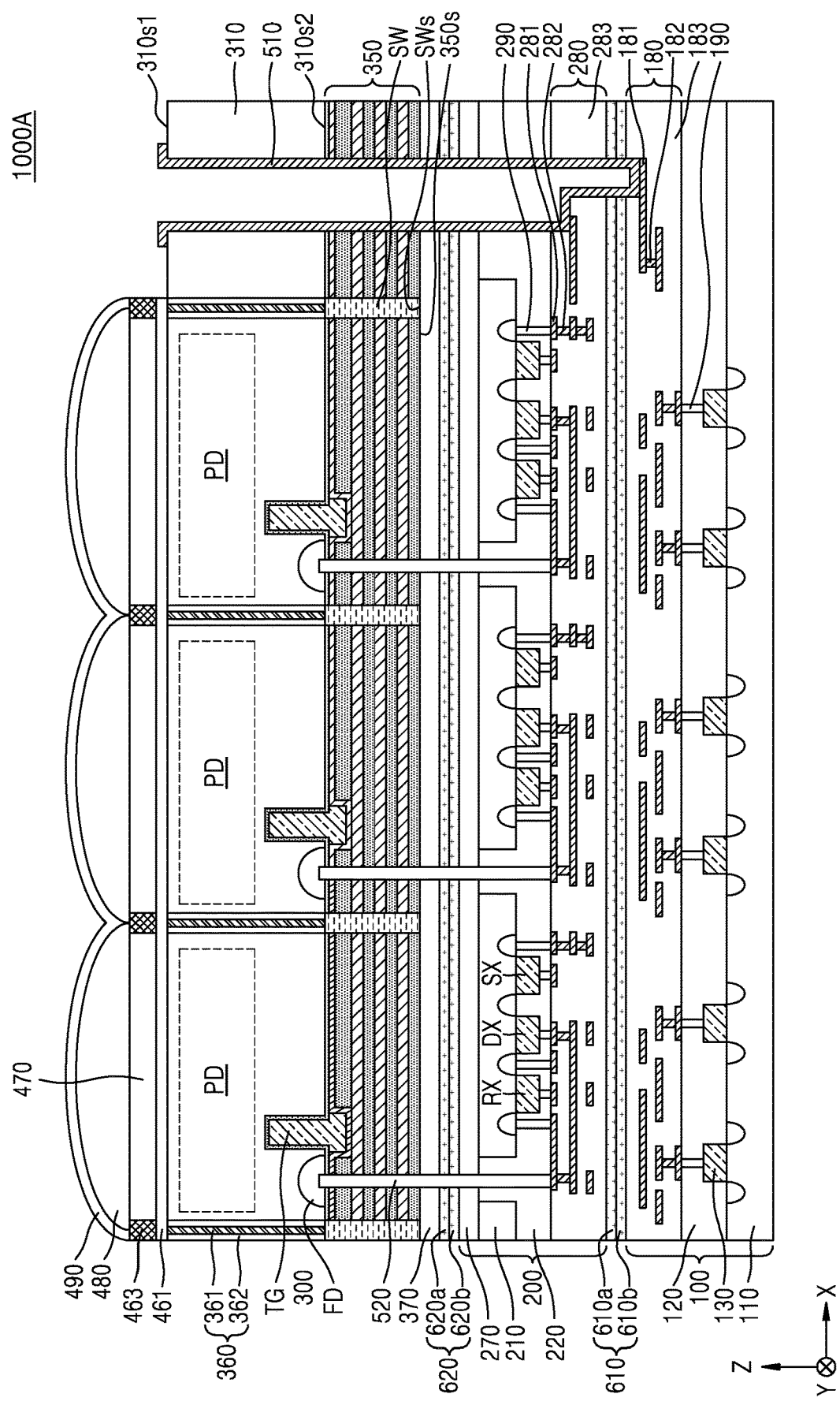
FIG. 4 is a cross-sectional view of an image sensor according to an embodiment of the inventive concept.

FIG. 4 is a cross-sectional view of an image sensor 1000A according to an embodiment of the inventive concept. Hereinafter, differences between the image sensor 1000 described with reference to FIGS. 1 to 3 and the image sensor 1000A shown in FIG. 4 will be described.

Referring to FIG. 4, in an embodiment, the third structure 300 further includes a partition wall SW that penetrates the reflective structure 350 in the vertical direction (Z direction). The lower surface SWs of the partition wall SW is coplanar with the lower surface 350s of the reflective structure 350. The partition wall SW is aligned in a vertical direction (Z direction) with the pixel isolation structure 360. The partition wall SW prevents light incident into the reflective structure 350 from entering the adjacent pixel region, so that crosstalk between adjacent pixel circuits is prevented. A refractive index of a material constituting the partition wall SW is less than at least one of a refractive index of a material constituting the second refractive index layer 352 or a refractive index of a material constituting the third refractive index layer 353. In some embodiments, the partition wall SW includes a low-k material or an air gap.

Figure 5:
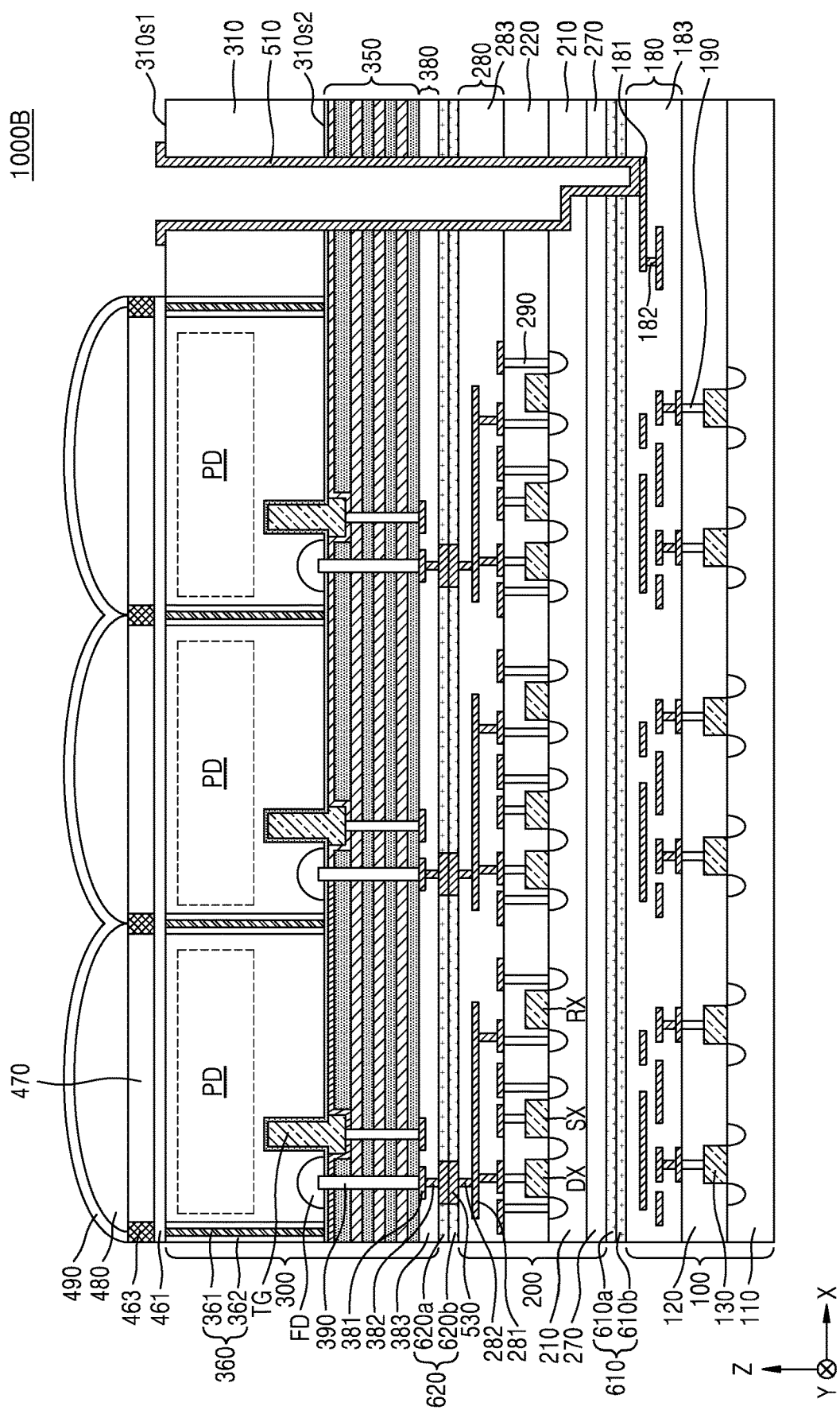
FIG. 5 is a cross-sectional view of an image sensor according to an embodiment of the inventive concept.

FIG. 5 is a cross-sectional view of an image sensor 1000B according to an embodiment of the inventive concept. Hereinafter, differences between the image sensor 1000 described with reference to FIGS. 1 to 3 and the image sensor 1000B shown in FIG. 5 will be described.

Referring to FIG. 5, in an embodiment, the second structure 200 and the third structure 300 are connected to each other through a pair of first bonding pads 530 instead of the second through via 520 of FIG. 1. The pair of first bonding pads 530 are interposed between the second structure 200 and the third structure 300. One of the pair of first bonding pads 530 is disposed on the upper surface of the second connection structure 280 of the second structure 200. The other of the pair of first bonding pads 530 is disposed on the lower surface of the third connection structure 380 of the third structure 300. The pair of first bonding pads 530 are in direct contact with each other. The pair of first bonding pads 530 include at least one of copper (Cu), aluminum (Al), silver (Ag), gold (Au), tungsten (W), titanium (Ti), or a combination thereof.

The first bonding insulating layer 270 in the second structure 200 directly contacts the first bonding layer 610. The second connection structure 280 in the second structure 200 directly contacts the second bonding layer 620.

The third structure 300 includes a third connection structure 380 instead of the second bonding insulating layer 370 illustrated in FIG. 1. The third connection structure 380 includes a third insulating layer 383 and a plurality of third conductive lines 381 and a plurality of third conductive vias 382 disposed in the third insulating layer 383. The third insulating layer 383 includes at least one of silicon oxide, silicon nitride, silicon oxynitride, a low-k material, or a combination thereof. The third conductive line 381 and the third conductive via 382 include at least one of copper (Cu), aluminum (Al), silver (Ag), gold (Au), titanium (Ti), tungsten (W), or a combination thereof. The third structure 300 further includes third contacts 390 that connect the third connection structure 380 and the floating diffusion FD region to each other, and that connect the third connection structure 380 and the transfer gate TG to each other. The third contacts 390 include at least one of tungsten (W), copper (Cu), aluminum (Al), silver (Ag), gold (Au), titanium (Ti), polysilicon, or a combination thereof.

Figure 6:
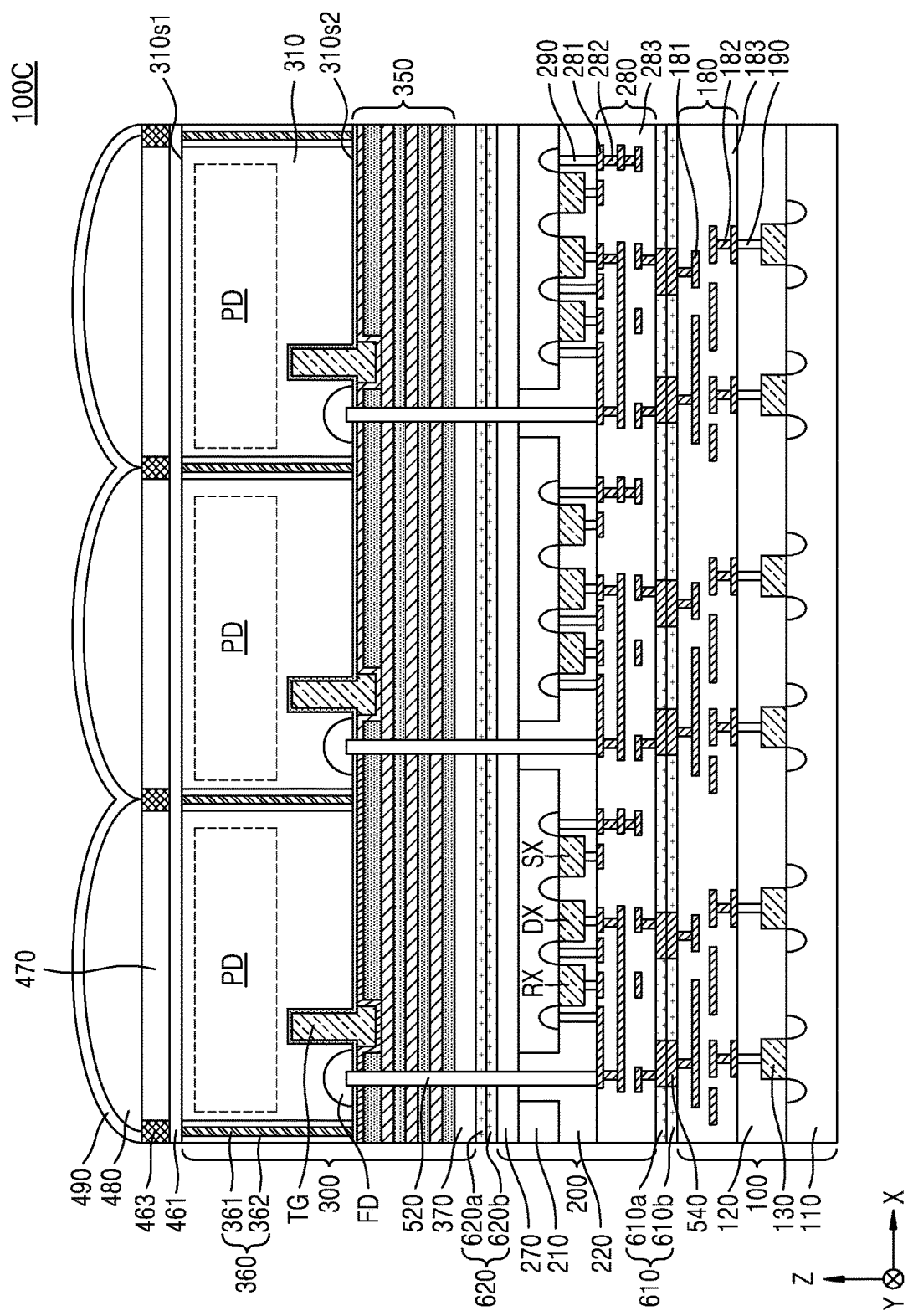
FIG. 6 is a cross-sectional view of an image sensor according to an embodiment of the inventive concept.

FIG. 6 is a cross-sectional view of an image sensor 1000C according to an embodiment of the inventive concept. Hereinafter, differences between the image sensor 1000 described with reference to FIGS. 1 to 3 and the image sensor 1000C shown in FIG. 6 will be described.

Referring to FIG. 6, in an embodiment, the first structure 100 and the second structure 200 are connected to each other through a pair of second bonding pads 540 instead of the first through via 510 of FIG. 1. The pair of second bonding pads 540 are interposed between the first structure 100 and the second structure 200. One of the pair of second bonding pads 540 is disposed on the upper surface of the first connection structure 180 of the first structure 100. The other of the pair of second bonding pads 540 is disposed on the lower surface of the second connection structure 280 of the second structure 200. The pair of second bonding pads 540 are in direct contact with each other. Each of the pair of second bonding pads 540 includes at least one of copper (Cu), aluminum (Al), silver (Ag), gold (Au), tungsten (W), titanium (Ti), or a combination thereof.

Figure 7:
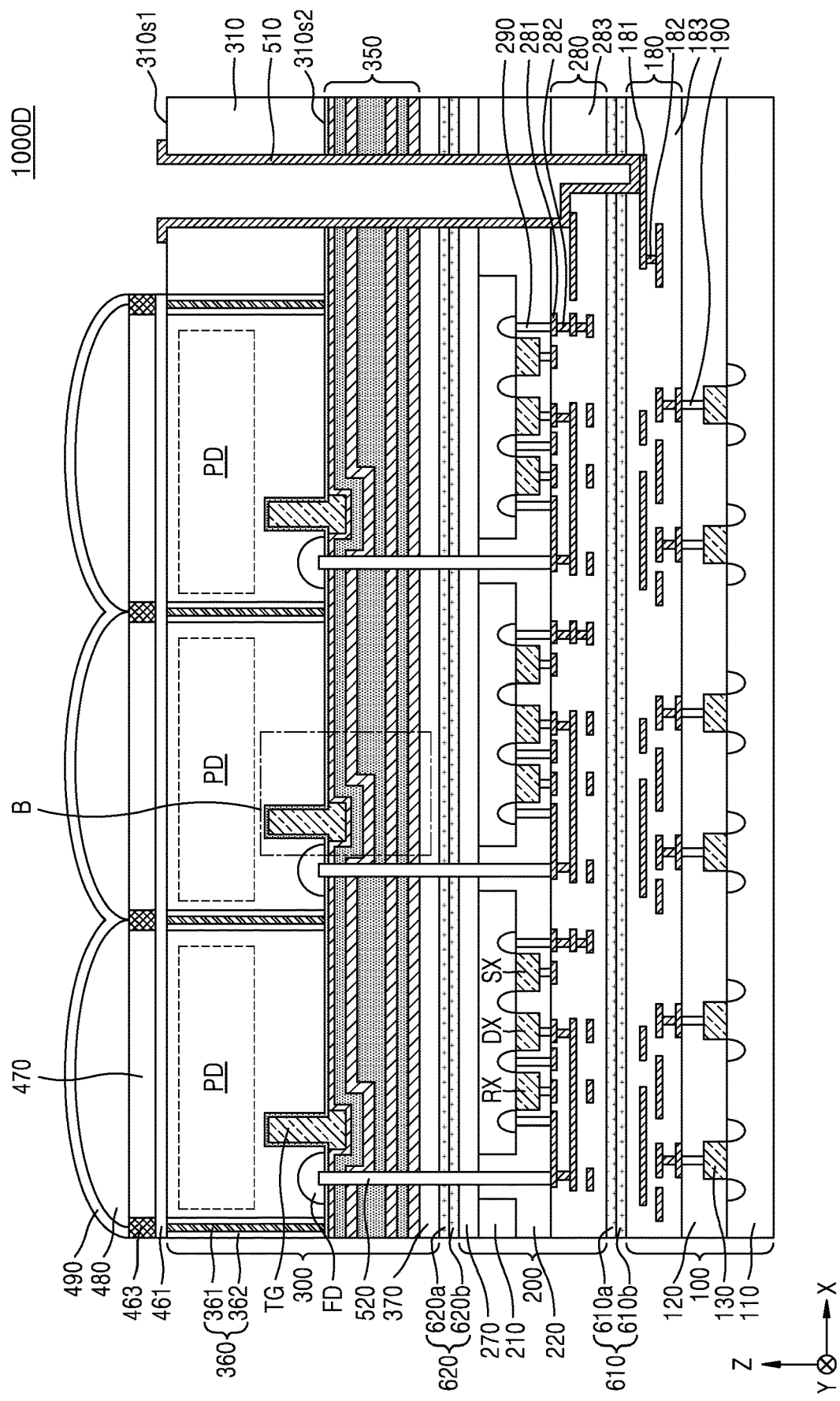
FIG. 7 is a cross-sectional view of an image sensor according to an embodiment of the inventive concept.
Figure 8:
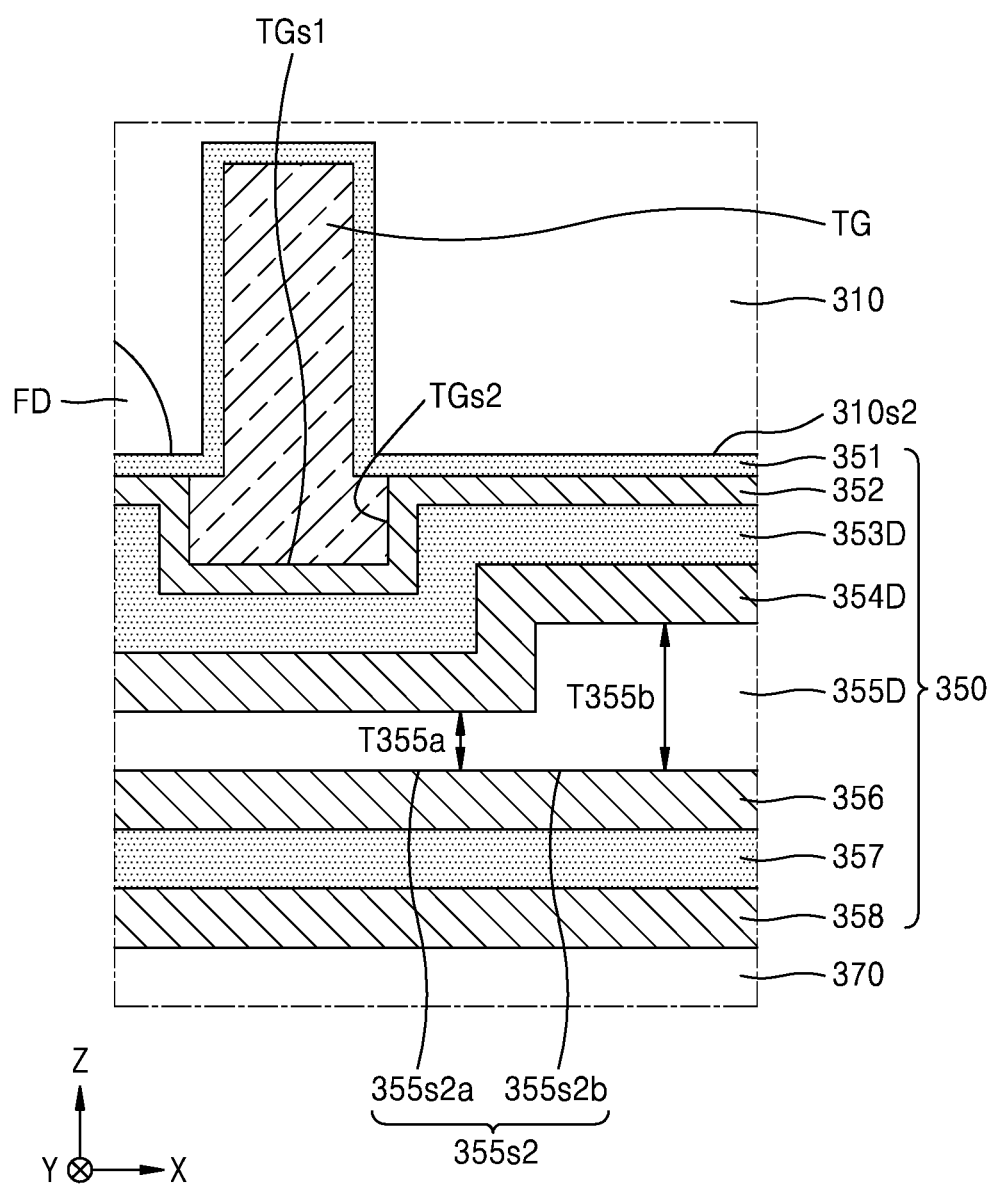
FIG. 8 is an enlarged view of area B of FIG. 7.

FIG. 7 is a cross-sectional view of an image sensor 1000D according to an embodiment of the inventive concept. FIG. 8 is an enlarged view of area B of FIG. 7. Hereinafter, differences between the image sensor 1000 described with reference to FIGS. 1 to 3 and the image sensor 1000D shown in FIGS. 7 and 8 will be described.

Referring to FIGS. 7 and 8, in an embodiment, a third refractive index layer 353D is disposed on the second refractive index layer 352. A fourth refractive index layer 345D is disposed on the third refractive index layer 353D. A fifth refractive index layer 355D is disposed on the fourth refractive index layer 354D. Due to the transfer gate TG, the first to fifth refractive index layers 351, 352, and 353D to 355D are not flat. Since the transfer gate TG extends into the reflective structure 350, the second refractive index layer 352, the third refractive index layer 353D and the fourth refractive index layer 345D have a stepped portion that conformally surrounds the transfer gate TG and partially extend into the fifth refractive index layer 355D. However, the sixth to eighth refractive index layers 356 to 358 are flat. The thickness T355a of the portion of the fifth refractive index layer 355D on the lower surface TGs1 of the transfer gate TG is less than the thickness T355b of the portion of the fifth refractive index layer 355D on the lower surface 310s2 of the third substrate 310. The lower surface 355s2a of the portion of the fifth refractive index layer 355D on the lower surface TGs1 of the transfer gate TG is coplanar with the lower surface 355s2b of the portion of the fifth refractive index layer 355D on the lower surface 310s2 of the third substrate 310. That is, the lower surface 355s2 of the fifth refractive index layer 355D is flat. Accordingly, the sixth to eighth refractive index layers 356 to 358 stacked on the lower surface 355s2 of the fifth refractive index layer 355D are flat.

Figure 9:
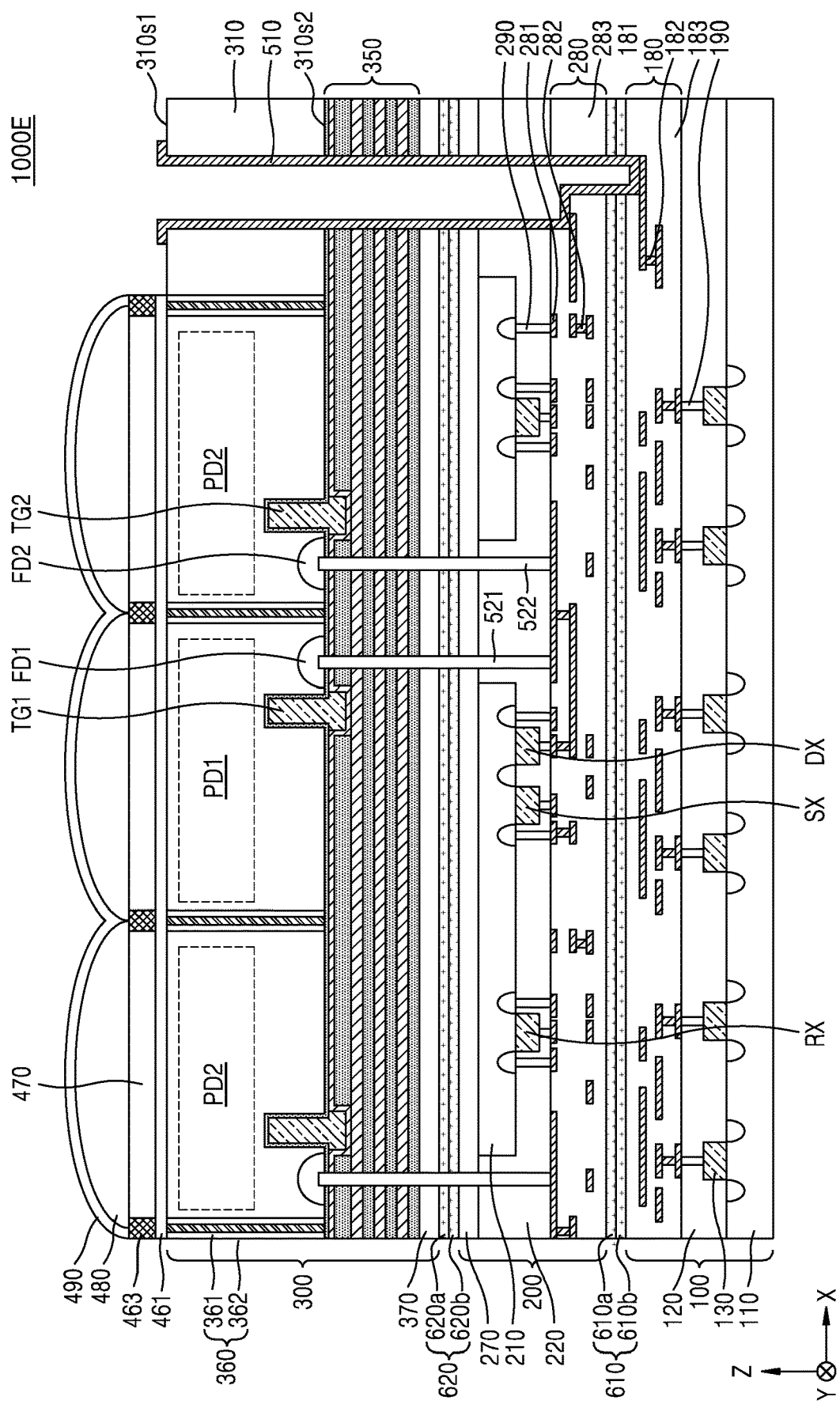
FIG. 9 is a cross-sectional view of an image sensor according to an embodiment of the inventive concept.
Figure 10:
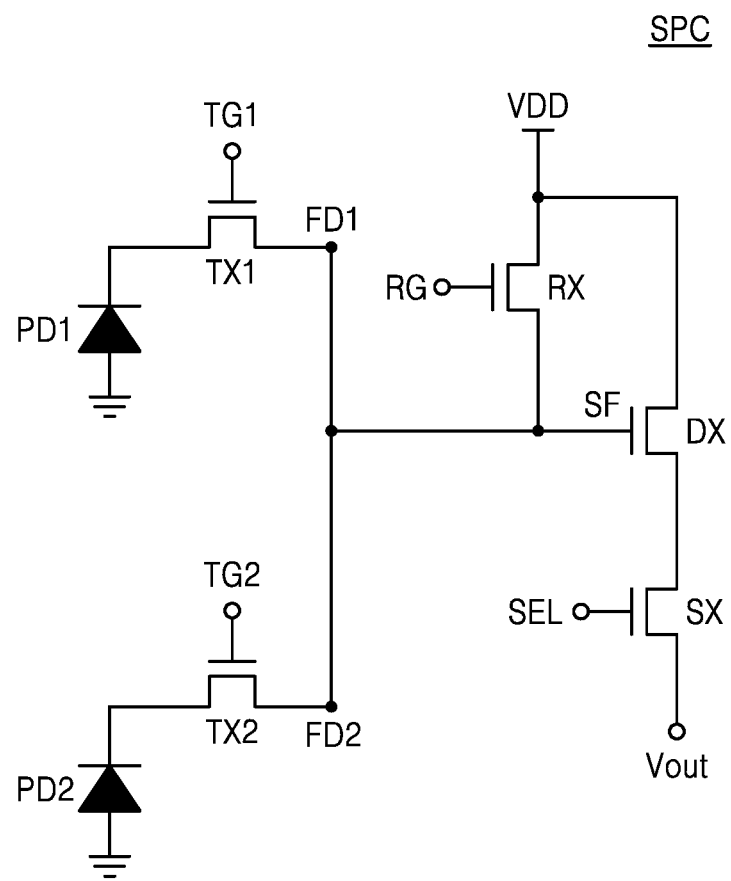
FIG. 10 is a circuit diagram of a shared pixel circuit in an image sensor according to an embodiment of the inventive concept.

FIG. 9 is a cross-sectional view of an image sensor 1000E according to an embodiment of the inventive concept. FIG. 10 is a circuit diagram of a shared pixel circuit SPC in the image sensor 1000E according to an embodiment of the inventive concept. Hereinafter, differences between the image sensor 1000 described with reference to FIGS. 1 to 3 and the image sensor 1000E shown in FIGS. 9 and 10 will be described.

Referring to FIGS. 9 and 10, according to an embodiment, a first photoelectric conversion region PD1, a first transfer gate TG1, a first floating diffusion region FD1, a second photoelectric conversion region PD2, a second transfer gate TG2, a second floating diffusion region FD2, a select transistor SX, a source follower transistor DX, and a reset transistor RX form a shared pixel circuit SPC. That is, the two pixel circuits PC (refer to FIG. 3) share the select transistor SX, the source follower transistor DX, and the reset transistor RX. In FIG. 10, two pixel circuits are illustrated as sharing the select transistor SX, the source follower transistor DX, and the reset transistor RX, but embodiments are not limited thereto, and in other embodiments, the number of pixel circuits sharing the select transistor SX, the source follower transistor DX, and the reset transistor RX is not limited to two.

The first photoelectric conversion region PD1 is connected to the first transfer transistor TX1, and the first transfer transistor TX1 is connected to the first floating diffusion region FD1. The second photoelectric conversion region PD2 is connected to the second transfer transistor TX2, and the second transfer transistor TX2 is connected to the second floating diffusion region FD2. The first floating diffusion region FD1 is connected to the reset transistor RX and the source follower transistor DX through a third through via 521. The second floating diffusion region FD2 is connected to the reset transistor RX and the source follower transistor DX through a fourth through via 522.

FIGS. 11A to 11F are cross-sectional views that illustrate a method of manufacturing an image sensor according to embodiments of the inventive concept.

Figure 11A:
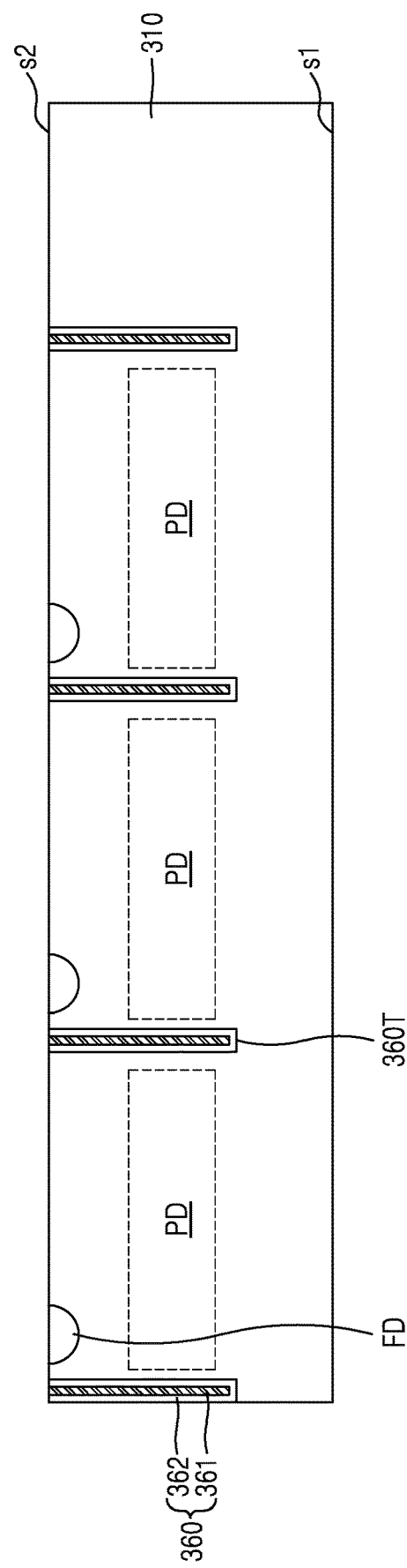
FIGS. 11A to 11F are cross-sectional views that illustrate a method of manufacturing an image sensor according to embodiments of the inventive concept.

Referring to FIG. 11A, in an embodiment, a third substrate 310 is prepared that includes a first surface s1 and a second surface s2 that face each other. A trench 360T is formed by removing a portion of the third substrate 310 from the second surface s2 of the third substrate 310. A pixel isolation insulating layer 362 is formed on the second surface s2 of the third substrate 310 and the trench 360T, and a pixel isolation conductive layer 361 is formed on the element isolation insulating layer 362. Then, by removing, for example, by polishing, portions of the element isolation insulating layer 362 and the pixel isolation conductive layer 361 on the second surface s2 of the third substrate 310, a pixel isolation structure 360 is formed in the trench 360T.

In addition, a photoelectric conversion region PD and a floating diffusion region FD are formed in the third substrate 310 by an ion implantation process from the second surface s2 of the third substrate 310.

Figure 11B:
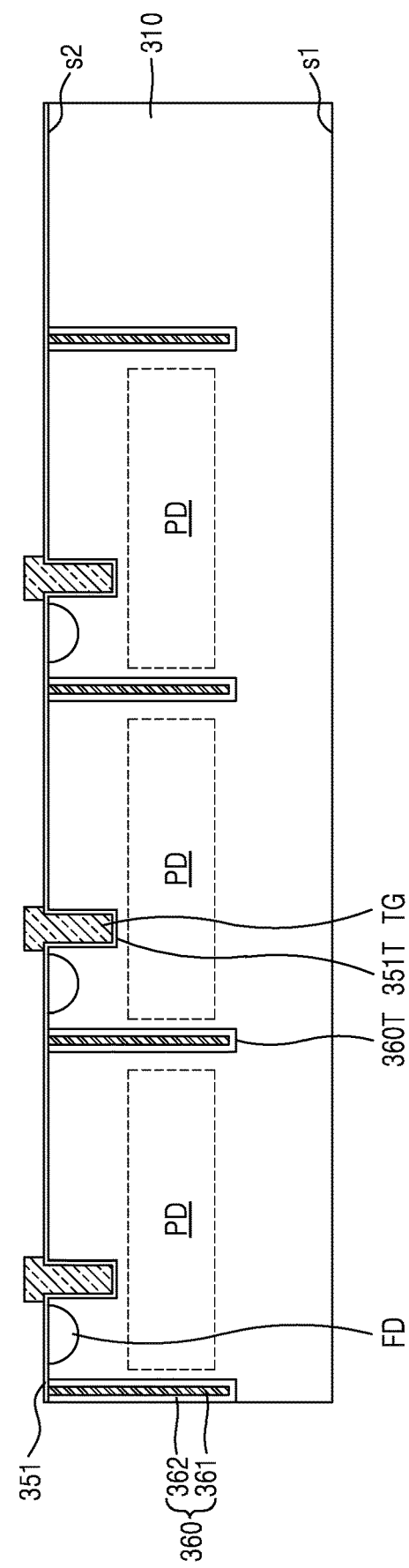

Referring to FIG. 11B, in an embodiment, a trench 351T is formed in the third substrate 310 by removing a portion of the third substrate 310 from the second surface s2 of the third substrate 310. A first refractive index layer 351 is formed on the trench 351T and the second surface s2 of the third substrate 310. A transfer gate TG that fills the trench 351T is formed on the first refractive index layer 351.

Figure 11C:
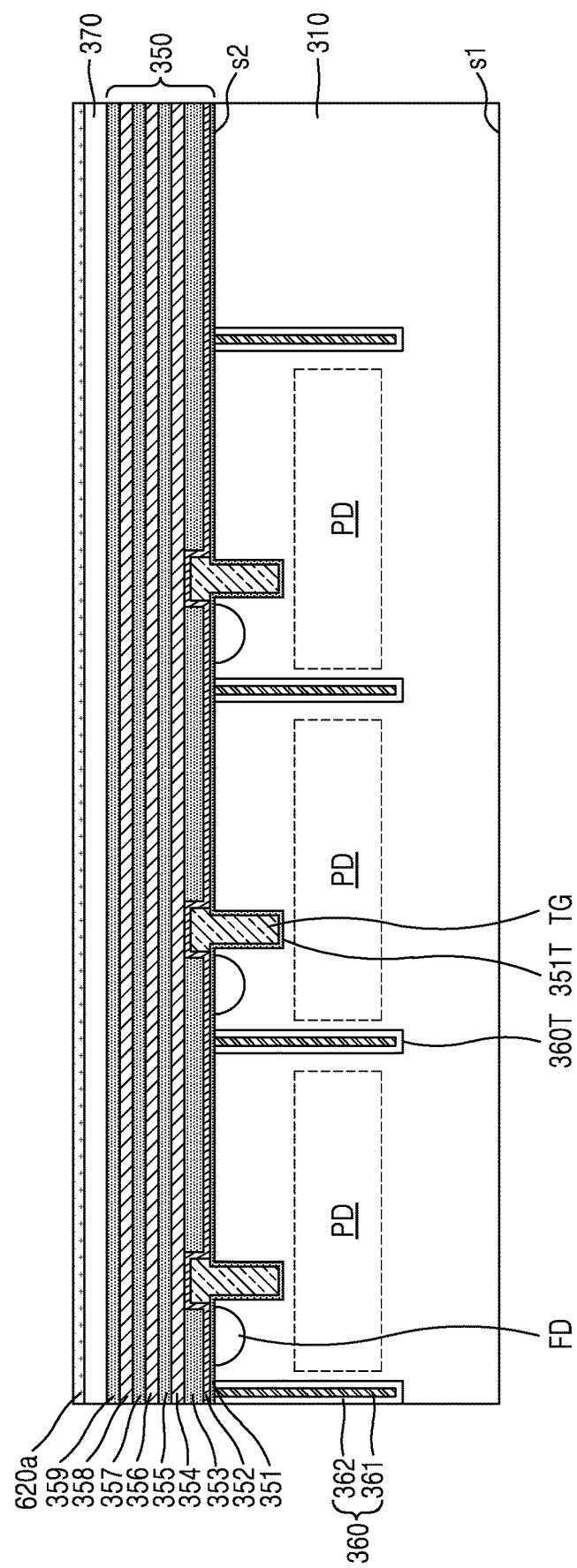

Referring to FIG. 11C, in an embodiment, a second refractive index layer 352 is conformally formed on the first refractive index layer 351 and the transfer gate TG. A third refractive index layer 353 is initially thickly formed on the second refractive index layer 352, and the third refractive index layer 353 is planarized to reduce its thickness and expose the second refractive index layer 352. The fourth to ninth refractive index layers 354 to 359 are sequentially stacked on the third refractive index layer 353 and the second refractive index layer 352. The fourth refractive index layer 354 is formed in direct contact with the second refractive index layer 352. The first to ninth refractive index layers 351 to 359 form a reflective structure 350. Due to the planarization process, the fourth to ninth refractive index layers 354 to 359 are flat. Accordingly, the reflectivity of the reflective structure 350 is increased.

Alternatively, in an embodiment, as shown in FIGS. 7 and 8, a third refractive index layer 353D is conformally formed on the second refractive index layer 352, and a fourth refractive index layer 354D is conformally formed on the third refractive index layer 353D. A fifth refractive index layer 355D is thickly formed on the fourth refractive index layer 354D. The fifth refractive index layer 355D is planarized so that the lower surface 355s2 of the fifth refractive index layer 355D is flat. The sixth to eighth refractive index layers 356 to 358 are sequentially stacked on the fifth refractive index layer 355D. Since the lower surface 355s2 of the fifth refractive index layer 355D is flat, the sixth to eighth refractive index layers 356 to 358 are formed to be flat. Accordingly, the reflectivity of the reflective structure 350 is increased.

In some embodiments, a trench is formed in the reflective structure 350 after the reflective structure 350 is formed. In some embodiments, the trench exposes the pixel isolation structure 360. The partition wall SW shown in FIG. 4 is formed in the trench in the reflective structure 350. For example, after forming a partition wall material in the trench and on the surface 350s of the reflective structure 350, the partition wall SW is formed by grinding the partition wall material so that the surface 350s of the reflective structure 350 is exposed.

Referring back to FIG. 11C, in an embodiment, a second bonding insulating layer 370 is formed on the reflective structure 350. A second sub-bonding layer 620a is formed on the second bonding insulating layer 370.

Figure 11D:
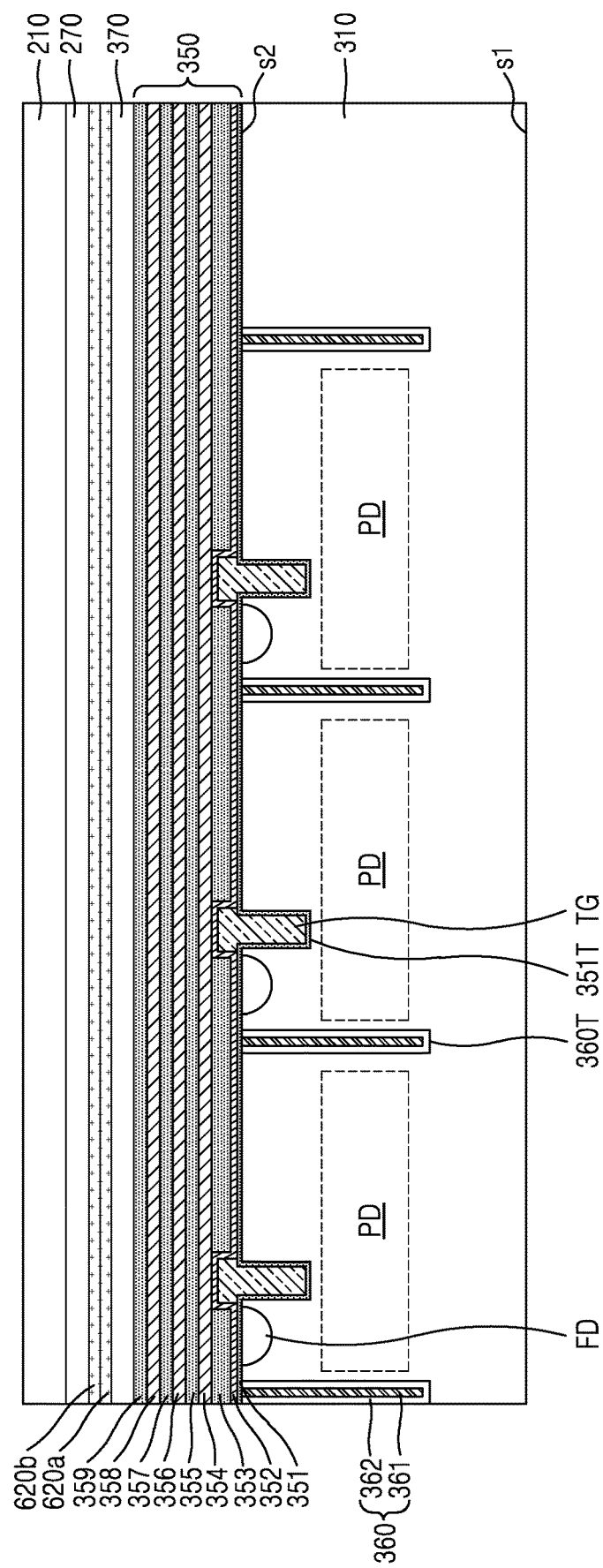

Referring to FIG. 11D, in an embodiment, a first bonding insulating layer 270 is formed on the second substrate 210. A second sub-bonding layer 620b is formed on the first bonding insulating layer 270. Then, by allowing the second sub-bonding layer 620a on the second bonding insulating layer 370 and the second sub-bonding layer 620b on the first bonding insulating layer 270 to come into direct contact with each other, the second substrate 210 is bonded to the reflective structure 350. In some embodiments, the second substrate 210 is polished to reduce its thickness.

Figure 11E:
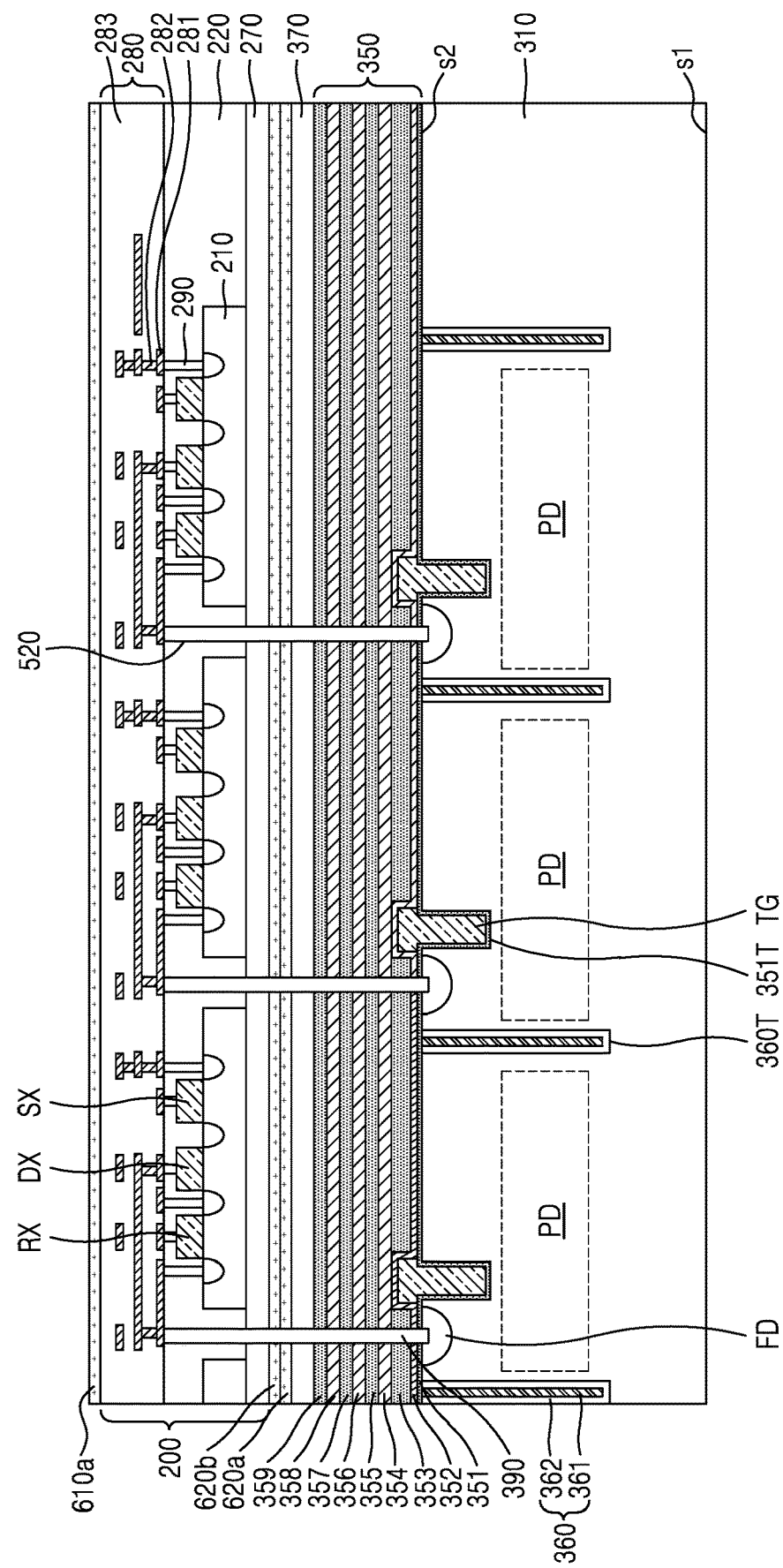

Referring to FIG. 11E, in an embodiment, a reset transistor RX, a source follower transistor DX, and a select transistor SX are formed on the second substrate 210. A second interlayer insulating layer 220 is formed that covers the second substrate 210, the reset transistor RX, the source follower transistor DX, and the select transistor SX. Contacts 290 are formed that penetrate the second interlayer insulating layer 220 and respectively contact the reset transistor RX, the source follower transistor DX, and the select transistor SX. In addition, a second through via 520 is formed that penetrates the second interlayer insulating layer 220, the first bonding insulating layer 270, the pair of sub-bonding layers 620a and 620b, the second bonding insulating layer 370, and the reflective structure 350 and contact the floating diffusion region FD. A second connection structure 280 is formed on the second interlayer insulating layer 220. Accordingly, the second structure 200 is completed. A first sub-bonding layer 610a is formed on the second connection structure 280.

Figure 11F:
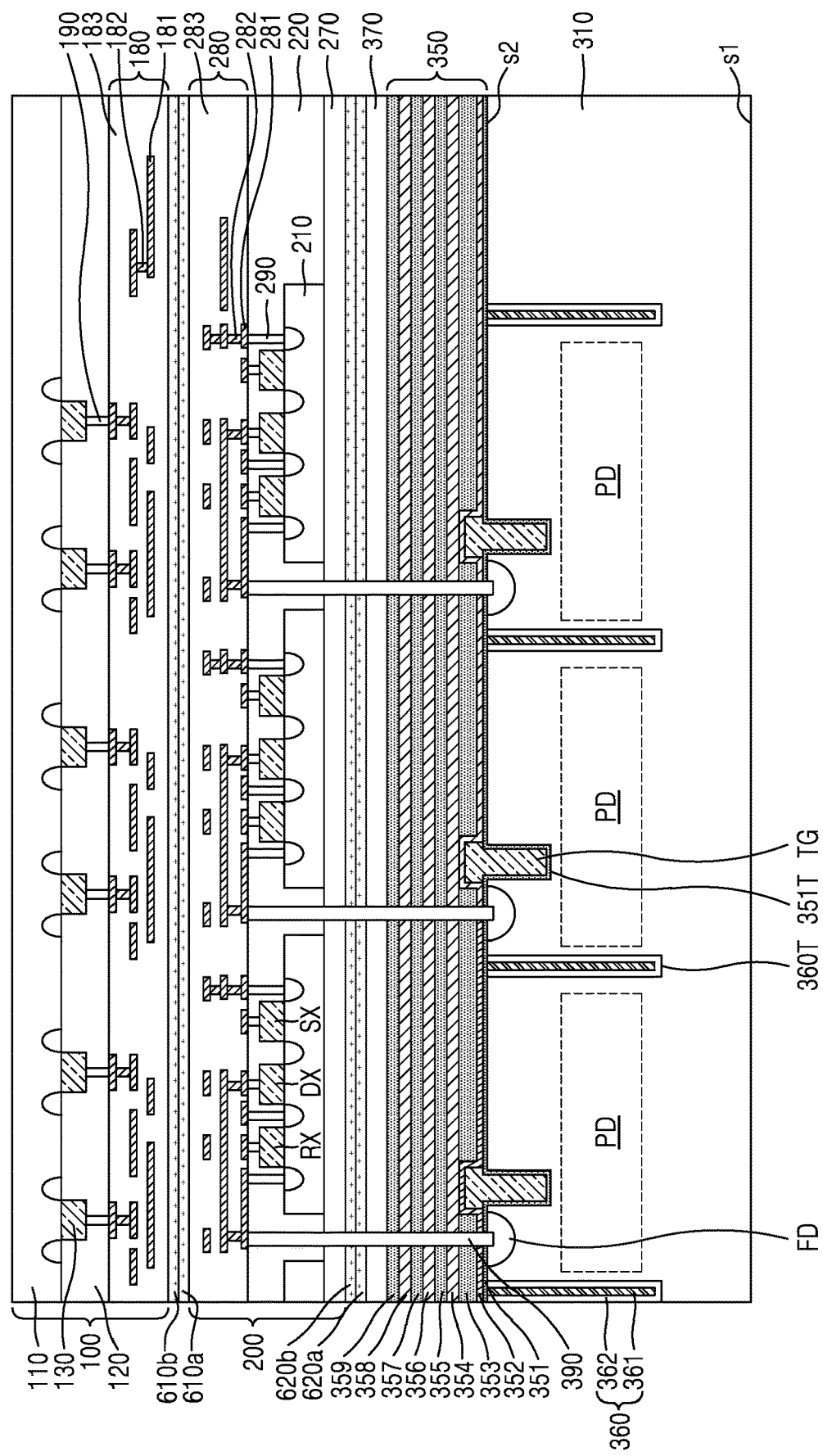

Referring to FIG. 11F, in an embodiment, a logic transistor 130 may be formed on the first substrate 110. A first interlayer insulating layer 120 is formed that covers the first substrate 110 and the logic transistor 130. A first contact 190 is formed that penetrates the first interlayer insulating layer 120 and contacts the logic transistor 130. A first connection structure 180 is formed on the first interlayer insulating layer 120. As a result, the first structure 100 is formed. A first sub-bonding layer 610b is formed on the first connection structure 180. The first structure 100 is bonded to the second structure 200 such that the pair of first sub-bonding layers 610a and 610b contact each other.

Referring to FIGS. 1 and 11F, a portion of the third substrate 310 is removed, for example, by polishing, from the first surface s1 of the third substrate 310 to expose the pixel isolation conductive layer 361. As described above, the newly formed surface of the third substrate 310 is the upper surface 310s1 of the third substrate 310. A first through via 510 is formed that penetrates the third structure 300 and the second structure 200 and electrically connects the second structure 200 and the first structure 100 to each other. An anti-reflective layer 461 is formed on the upper surface 310s1 of the third substrate 310. A fence 463 is formed on the anti-reflective layer 461. A microlens 480 is formed on the color filter 470 and the fence 463. A capping layer 490 is formed on the microlens 380. Accordingly, the image sensor 1000 is completed.

Figure 12A:
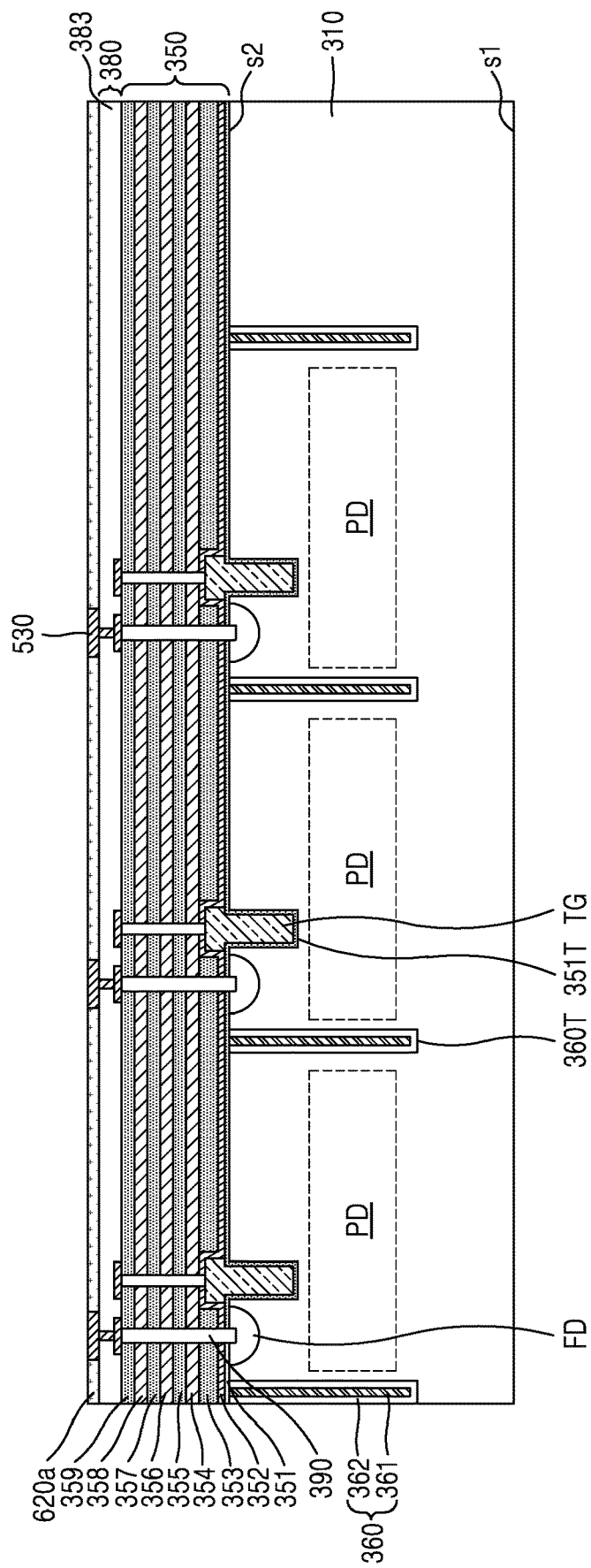
FIGS. 12A to 12C are cross-sectional views that illustrate a method of manufacturing an image sensor according to embodiments of the inventive concept.
Figure 12B:
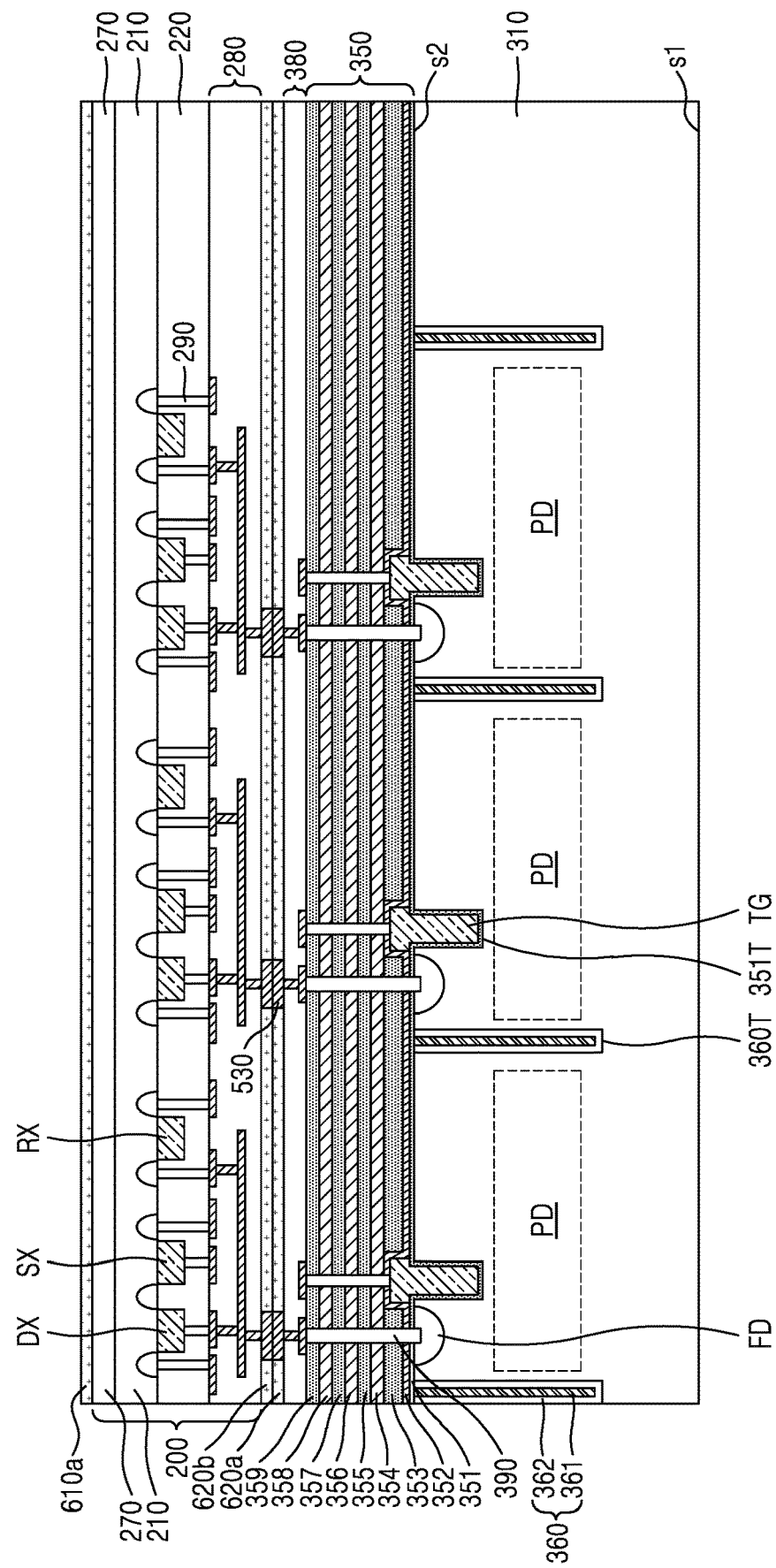
Figure 12C:
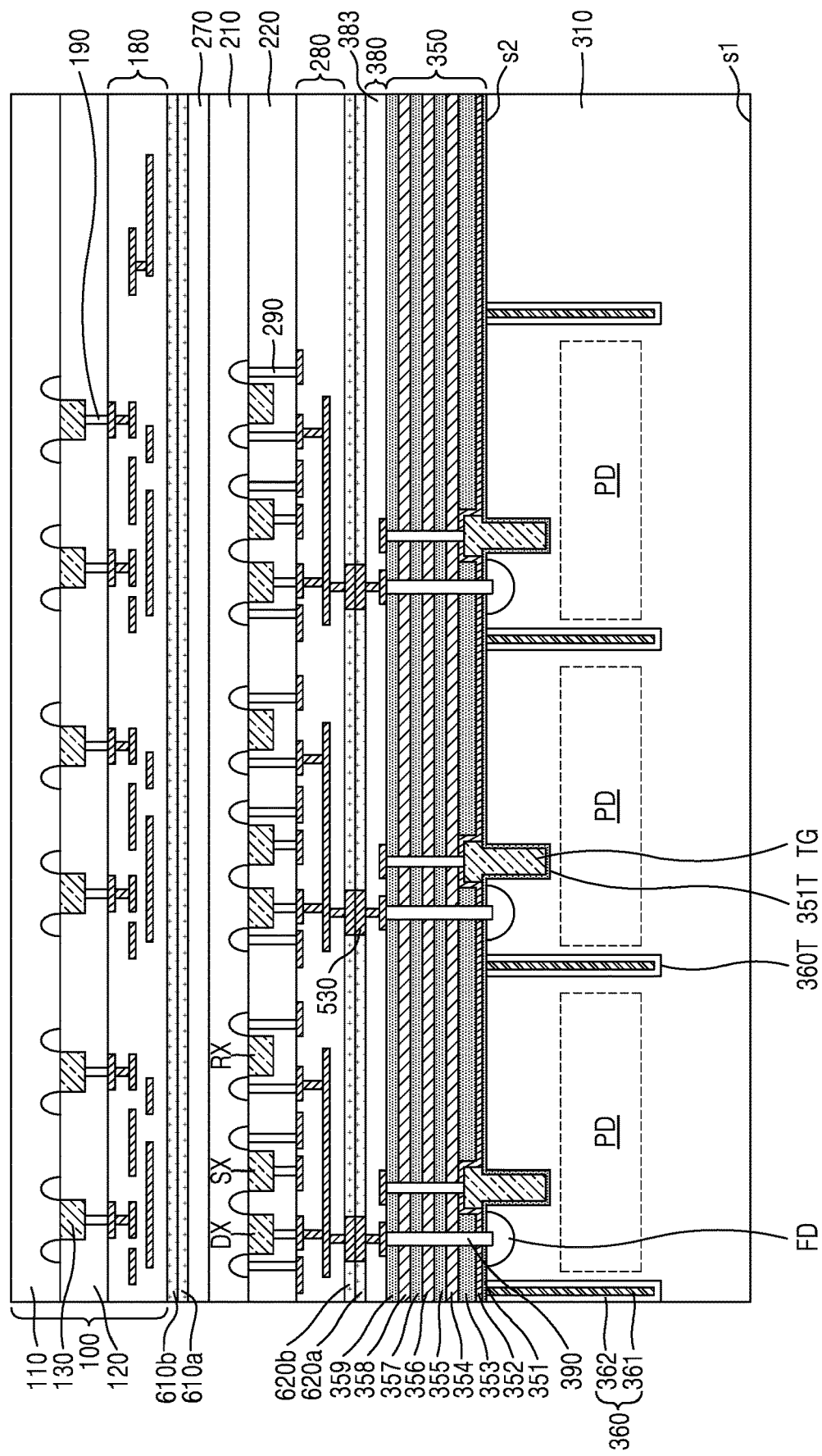

FIGS. 12A to 12C are cross-sectional views that illustrate a method of manufacturing an image sensor according to embodiments of the inventive concept.

Referring to FIG. 12A, in an embodiment, a third substrate 310 is prepared that includes a first surface s1 and a second surface s2 that face each other. A trench 360T is formed by removing a portion of the third substrate 310 from the second surface s2 of the third substrate 310. A pixel isolation insulating layer 362 is formed on the second surface s2 of the third substrate 310 and the trench 360T, and a pixel isolation conductive layer 361 is formed on the element isolation insulating layer 362. Then, by removing, for example, by polishing, portions of the element isolation insulating layer 362 and the pixel isolation conductive layer 361 on the second surface s2 of the third substrate 310, a pixel isolation structure 360 is formed in the trench 360T.

In addition, a photoelectric conversion region PD and a floating diffusion region FD are formed in the third substrate 310 by an ion implantation process from the second surface s2 of the third substrate 310.

A trench 351T is formed in the third substrate 310 by removing a portion of the third substrate 310 from the second surface s2 of the third substrate 310. A first refractive index layer 351 is formed on the trench 351T and the second surface s2 of the third substrate 310. A transfer gate TG that fills the trench 351T is formed on the first refractive index layer 351.

A second refractive index layer 352 is conformally formed on the first refractive index layer 351 and the transfer gate TG. A third refractive index layer 353 is initially thickly formed on the second refractive index layer 352, and the third refractive index layer 353 is planarized to reduce its thickness and expose the second refractive index layer 352. The fourth to ninth refractive index layers 354 to 359 are sequentially stacked on the third refractive index layer 353 and the second refractive index layer 352. The fourth refractive index layer 354 is formed in direct contact with the second refractive index layer 352. The first to ninth refractive index layers 351 to 359 form a reflective structure 350.

Third contacts 390 are formed that penetrate the reflective structure 350 and contact the floating diffusion region FD and the transfer gate TG, respectively. A third connection structure 380 is formed on the reflective structure 350. A second sub-bonding layer 620a is formed on the third connection structure 380. A first bonding pad 530 is formed on the third connection structure 380.

Referring to FIG. 12B, in an embodiment, a reset transistor RX, a source follower transistor DX, and a select transistor SX are formed on the second substrate 210. A second interlayer insulating layer 220 is formed that covers the second substrate 210, the reset transistor RX, the source follower transistor DX, and the select transistor SX. Second contacts 290 are formed that penetrate the second interlayer insulating layer 220 and respectively contact the reset transistor RX, the source follower transistor DX, and the select transistor SX. A second connection structure 280 is formed on the second interlayer insulating layer 220. Accordingly, the second structure 200 is completed. A second sub-bonding layer 620b is formed on the second connection structure 280. A first bonding pad 530 is formed on the second connection structure 290. The second structure 200 is bonded to the third connection structure 380 so that the pair of first bonding pads 530 contact each other. In some embodiments, the second substrate 210 is polished to reduce its thickness. A first bonding insulating layer 270 is formed on the second substrate 210. A first sub-bonding layer 610a is formed on the first bonding insulating layer 270.

Referring to FIG. 12C, in an embodiment, a logic transistor 130 is formed on the first substrate 110. A first interlayer insulating layer 120 is formed that covers the first substrate 110 and the logic transistor 130. A first contact 190 is formed that penetrates the first interlayer insulating layer 120 and contacts the logic transistor 130. A first connection structure 180 is formed on the first interlayer insulating layer 120. As a result, the first structure 100 is formed. A first sub-bonding layer 610b is formed on the first connection structure 180. The first structure 100 is bonded to the second structure 200 such that the pair of first sub-bonding layers 610a and 610b contact each other.

Referring to FIGS. 5 and 12C, in an embodiment, a portion of the third substrate 310 is removed, for example, by polishing, from the first surface s1 of the third substrate 310 to expose the pixel isolation conductive layer 361. As described above, the newly formed surface of the third substrate 310 is the upper surface 310s1 of the third substrate 310. A first through via 510 is formed that penetrates the third structure 300 and the second structure 200 and electrically connects the second structure 200 and the first structure 100 to each other. An anti-reflective layer 461 is formed on the upper surface 310s1 of the third substrate 310. A fence 463 is formed on the anti-reflective layer 461. A microlens 480 is formed on the color filter 470 and the fence 463. A capping layer 490 is formed on the microlens 380. Accordingly, the image sensor 1000B is completed.

Referring to FIG. 6, in an embodiment, a pixel isolation structure 360 is formed in the third substrate 310 as described with reference to FIG. 11A. In addition, as described with reference to FIG. 11A, a photoelectric conversion region PD and a floating diffusion region FD are formed in the third substrate 310.

Referring to FIG. 11B, in an embodiment, a transfer gate TG and a reflective structure 350 are formed. Referring to FIG. 11C, in an embodiment, a second bonding insulating layer 370 is formed on the reflective structure 350. A second sub-bonding layer 620a is formed on the second bonding insulating layer 370.

Referring to FIG. 11D, in an embodiment, a first bonding insulating layer 270 is formed on the second substrate 210. A second sub-bonding layer 620b may be formed on the first bonding insulating layer 270. Then, by allowing the second sub-bonding layer 620a on the second bonding insulating layer 370 and the second sub-bonding layer 620b on the first bonding insulating layer 270 to come into direct contact with each other, the second substrate 210 is bonded to the reflective structure 350. In some embodiments, the second substrate 210 is polished to reduce its thickness.

Referring to FIG. 11E, in an embodiment, a reset transistor RX, a source follower transistor DX, and a select transistor SX are formed on the second substrate 210. A second interlayer insulating layer 220 is formed that covers the second substrate 210, the reset transistor RX, the source follower transistor DX, and the select transistor SX. Second contacts 290 are formed that penetrate the second interlayer insulating layer 220 and respectively contact the reset transistor RX, the source follower transistor DX, and the select transistor SX. In addition, a second through via 520 is formed that penetrates the second interlayer insulating layer 220, the first bonding insulating layer 270, the pair of sub-bonding layers 620a and 620b, the second bonding insulating layer 370, and the reflective structure 350 and contacts the floating diffusion region FD. A second connection structure 280 is formed on the second interlayer insulating layer 220. Accordingly, the second structure 200 is completed. A first sub-bonding layer 610a is formed on the second connection structure 280. A second bonding pad 540 is formed on the second connection structure 280.

Referring to FIG. 11F, in an embodiment, a logic transistor 130 is formed on the first substrate 110. A first interlayer insulating layer 120 is formed that covers the first substrate 110 and the logic transistor 130. A first contact 190 is formed that penetrates the first interlayer insulating layer 120 and contacts the logic transistor 130. A first connection structure 180 is formed on the first interlayer insulating layer 120. As a result, the first structure 100 is formed. A first sub-bonding layer 610b is formed on the first connection structure 180. Referring to FIG. 6, in an embodiment, a second bonding pad 540 is formed on the first connection structure 180. The first structure 100 is bonded to the second structure 200 so that the pair of second bonding pads 540 contact each other.

Referring to FIGS. 6 and 11F, in an embodiment, a portion of the third substrate 310 is removed, for example, by polishing, from the first surface s1 of the third substrate 310 to expose the pixel isolation conductive layer 361. As described above, the newly formed surface of the third substrate 310 is the upper surface 310s1 of the third substrate 310. An anti-reflective layer 461 is formed on the upper surface 310s1 of the third substrate 310. A fence 463 is formed on the anti-reflective layer 461. A microlens 480 is formed on the color filter 470 and the fence 463. A capping layer 490 is formed on the microlens 380. Accordingly, the image sensor 1000C is completed.

While embodiments of the inventive concept has been particularly shown and described with reference to the accompanying drawings, it will be understood that various changes in form and details may be made therein without departing from the spirit and scope of the following claims.

What is claimed is:

1. An image sensor, comprising:
a first structure, a second structure, and a third structure that are sequentially stacked in a vertical direction,
wherein the first structure comprises a first substrate and at least one first transistor disposed on the first substrate,
wherein the second structure comprises a second substrate and at least one second transistor disposed on the second substrate,
wherein the third structure comprises:
a third substrate that includes an upper surface on which light is incident and a lower surface that is opposite to the upper surface;
a photoelectric conversion region disposed in the third substrate;
a transfer gate disposed on the lower surface of the third substrate; and
a reflective structure disposed on the lower surface of the third substrate and on a lower surface and a side surface of the transfer gate,
wherein the reflective structure comprises a first refractive index layer disposed on the lower surface of the third substrate and on the lower surface and the side surface of the transfer gate, and a second refractive index layer disposed on a lower surface of a portion of the first refractive index layer that is on the lower surface of the third substrate, and
wherein the lower surface of the portion of the first refractive index layer on the lower surface of the transfer gate and a lower surface of the second refractive index layer are coplanar.

2. The image sensor of claim 1,
wherein the reflective structure further comprises a third refractive index layer disposed on the lower surface of the second refractive index layer, wherein the third refractive index layer is in direct contact with the first refractive index layer.

3. The image sensor of claim 2,
wherein a thickness of the third refractive index layer is greater than a thickness of the first refractive index layer.

4. The image sensor of claim 1,
wherein the reflective structure further comprises a fifth refractive index layer that extends between the first refractive index layer and the third substrate and between the transfer gate and the third substrate.

5. The image sensor of claim 4, wherein a thickness of the fifth refractive index layer is less than a thickness of the first refractive index layer.

6. The image sensor of claim 1, wherein the third structure further comprises a partition wall that penetrates the reflective structure in the vertical direction.

7. The image sensor of claim 6, wherein a lower surface of the partition wall and a lower surface of the reflective structure are coplanar.

8. The image sensor of claim 6, wherein a refractive index of a material that constitutes the partition wall is less than at least one of a first refractive index of a first material that constitutes the first refractive index layer and a second refractive index of a second material that constitutes the second refractive index layer.

9. The image sensor of claim 6, wherein the third structure further comprises a pixel isolation structure that surrounds the photoelectric conversion region, and wherein the partition wall is vertically aligned with the pixel isolation structure.

10. The image sensor of claim 1, wherein the third structure further comprises a floating diffusion region disposed in the third substrate, wherein the image sensor further comprises a through via that penetrates the reflective structure and contacts the floating diffusion region, and wherein the through via is in direct contact with the reflective structure.

11. The image sensor of claim 1, wherein the transfer gate extends into the first substrate.

12. The image sensor of claim 1, wherein the third structure further comprises a floating diffusion region disposed in the third substrate, and wherein the at least one second transistor comprises a reset transistor configured to reset charges accumulated in the floating diffusion region, a source follower transistor configured to amplify potential changes in the floating diffusion region, and a select transistor configured to select a pixel circuit.

13. The image sensor of claim 1, further comprising: a first bonding layer interposed between the first structure and the second structure.

14. The image sensor of claim 1, further comprising: a second bonding layer interposed between the second structure and the third structure.

15. The image sensor of claim 1, further comprising: a first through via that electrically connects the first structure and the second structure to each other.

16. The image sensor of claim 1, further comprising: a pair of first bonding pads that electrically connect the first structure and the second structure to each other, wherein the pair of first bonding pads are in direct contact with each other.

17. The image sensor of claim 1, further comprising: a second through via that electrically connects the second structure and the third structure to each other.

18. The image sensor of claim 1, further comprising: a pair of second bonding pads that electrically connect the first structure and the third structure to each other, wherein the pair of second bonding pads are in direct contact with each other.

19. An image sensor, comprising:
a first structure, a second structure, and a third structure that are sequentially stacked in a vertical direction,
wherein the first structure comprises a first substrate and at least one first transistor disposed on the first substrate,
wherein the second structure comprises a second substrate and at least one second transistor disposed on the second substrate,
wherein the third structure comprises:
a third substrate that includes an upper surface on which light is incident and a lower surface that is opposite to the upper surface;
a photoelectric conversion region disposed in the third substrate;
a transfer gate disposed on the lower surface of the third substrate; and
a reflective structure disposed on the lower surface of the third substrate and a lower surface and a side surface of the transfer gate,
wherein the reflective structure comprises a first refractive index layer disposed on the lower surface of the third substrate and on the lower surface and the side surface of the transfer gate, and a second refractive index layer disposed on the first refractive index layer, and
wherein a lower surface of a portion of the second refractive index layer on a portion of the first refractive index layer on the lower surface of the transfer gate and a lower surface of a portion of the second refractive index layer on a portion of the first refractive index layer on the lower surface of the third substrate are coplanar.

20. An image sensor, comprising:
a first structure, and a second structure that are sequentially stacked in a vertical direction,
wherein the first structure comprises a first substrate, and a reset transistor and a source follower transistor disposed on the first substrate,
wherein the second structure comprises:
a second substrate that includes an upper surface on which light is incident and a lower surface opposite to the upper surface;
a plurality of photoelectric conversion regions disposed in the second substrate;
a plurality of transfer gates disposed on the lower surface of the second substrate and that are respectively connected to the plurality of photoelectric conversion regions;
a plurality of floating diffusion regions disposed on the lower surface of the second substrate and that are respectively connected to the plurality of transfer gates; and
a reflective structure disposed on the lower surface of the second substrate and a lower surface and a side surface of the transfer gate,
wherein the plurality of floating diffusion regions are commonly connected to each of the reset transistor and the source follower transistor,
wherein the reflective structure comprises a first refractive index layer disposed on the lower surface of the second substrate and on the lower surface and the side surface of the transfer gate, and a second refractive index layer disposed on a lower surface of a portion of the first refractive index layer on the lower surface of the second substrate, and wherein the lower surface of the portion of the first refractive index layer on the lower surface of the transfer gate and a lower surface of the second refractive index layer are coplanar.

* * * * *